United States Patent
Wu et al.

(10) Patent No.: US 10,978,160 B2
(45) Date of Patent: Apr. 13, 2021

(54) MITIGATING GROWN BAD BLOCKS

(71) Applicant: SanDisk Technologies LLC, Addison, TX (US)

(72) Inventors: Jianzhi Wu, Milpitas, CA (US); Xiang Yang, Santa Clara, CA (US); Jun Wan, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/236,792

(22) Filed: Dec. 31, 2018

(65) Prior Publication Data

US 2020/0211652 A1 Jul. 2, 2020

(51) Int. Cl.
| | |
|---|---|
| G11C 16/16 | (2006.01) |
| G11C 29/00 | (2006.01) |
| G06F 3/06 | (2006.01) |
| G06F 12/02 | (2006.01) |

(52) U.S. Cl.
CPC .............. *G11C 16/16* (2013.01); *G06F 3/064* (2013.01); *G06F 12/0246* (2013.01); *G11C 29/76* (2013.01)

(58) Field of Classification Search
CPC ......... G11C 16/14; G11C 16/16; G11C 29/76; G06F 3/064; G06F 12/0246
See application file for complete search history.

(56) References Cited

U.S. PATENT DOCUMENTS

| | | | |
|---|---|---|---|
| 7,200,708 B1 | 4/2007 | Kreifels | |
| 7,400,537 B2 | 7/2008 | Hemink et al. | |
| 7,403,424 B2 | 7/2008 | Hemink et al. | |
| 7,414,891 B2 | 8/2008 | Sivero et al. | |
| 7,995,392 B2 | 8/2011 | Shibata | |
| 8,527,819 B2 | 9/2013 | Shalvi et al. | |
| 8,830,717 B2 | 9/2014 | Avila et al. | |
| 8,913,431 B1 | 12/2014 | Costa et al. | |

(Continued)

FOREIGN PATENT DOCUMENTS

| | | |
|---|---|---|
| CN | 201380062544 A | 8/2015 |
| KR | 20150099729 A | 9/2015 |

(Continued)

OTHER PUBLICATIONS

"HCS08:" NXP, Freescale.com, Jul. 2008, www.nxp.com/docs/en/data-sheet/MC9S08EL32.pdf. MC9S08EL32 MC9S08EL16 MC9S08SL16 MC9S08SL8 Data Sheet, pp. 1-356.

(Continued)

*Primary Examiner* — Tri M Hoang
(74) *Attorney, Agent, or Firm* — Volpe Koenig

(57) ABSTRACT

Example techniques that mitigate against memory hole shorts during an erase operation for memory cells in a string include an example method in which, during an erase operation, erase pulses are applied to the word lines of the memory string and terminated at different times based. In some instances, the erase pulses applied to the word lines of the memory string are terminated based on the temperature of the memory cells of the memory string. In further implementations, the erase pulses applied to the word lines of the memory string are boosted for different times depending on the location of the word line along the memory string during the erase operation.

18 Claims, 16 Drawing Sheets

(56) References Cited

U.S. PATENT DOCUMENTS

| | | | |
|---|---|---|---|
| 8,929,148 B2 | 1/2015 | Kim | |
| 8,958,249 B2 | 2/2015 | Dutta et al. | |
| 9,064,586 B2 | 6/2015 | Kato | |
| 9,070,474 B2 | 6/2015 | Izumi | |
| 9,171,620 B2 | 10/2015 | Avila et al. | |
| 9,229,856 B2 | 1/2016 | Avila et al. | |
| 9,236,139 B1 | 1/2016 | Lai et al. | |
| 9,343,160 B1 | 5/2016 | Dutta et al. | |
| 9,343,171 B1 | 5/2016 | Sun et al. | |
| 9,558,834 B2 | 1/2017 | Choe et al. | |
| 9,679,659 B2 | 6/2017 | Shim et al. | |
| 9,704,570 B2 | 7/2017 | Abe et al. | |
| 9,741,438 B2 | 8/2017 | Kwak et al. | |
| 9,760,307 B2 | 9/2017 | Avila et al. | |
| 9,905,306 B2 | 2/2018 | Suzuki et al. | |
| 9,922,714 B1* | 3/2018 | Yu | G11C 16/14 |
| 2010/0110796 A1 | 5/2010 | Park et al. | |
| 2012/0243309 A1* | 9/2012 | Asaoka | H01L 27/1157 365/182 |
| 2014/0149641 A1 | 5/2014 | Avila et al. | |
| 2014/0351496 A1 | 11/2014 | Avila et al. | |
| 2015/0121156 A1 | 4/2015 | Raghu et al. | |
| 2015/0262698 A1 | 9/2015 | Shirakawa | |
| 2016/0049199 A1 | 2/2016 | Nishikawa et al. | |
| 2017/0069389 A1* | 3/2017 | Park | G11C 16/14 |
| 2017/0285969 A1 | 10/2017 | Madraswala et al. | |

FOREIGN PATENT DOCUMENTS

| | | |
|---|---|---|
| WO | 2014085238 A2 | 6/2014 |
| WO | 2014085257 A1 | 6/2014 |

OTHER PUBLICATIONS

Micheloni et al. "Architectural and Integration Options for 3D NAND Flash Memories." Computers, vol. 6, No. 3, Oct. 2017, p. 27., doi:10.3390/computers6030027.

Micheloni, R., et al. "2 NAND Overview: from Memory to Systems." Inside NAND Flash Memories, 2010, pp. 19-53., doi:10.1007/978-90-481-9431-5_2.

Novotny R., et al. "NAND Flash Memory Organization and Operations." Journal of Information Technology & Software Engineering, vol. 05, No. 01, 2015, doi:10.4172/2165-7866.1000139.

\* cited by examiner

| WordLine | GBB Count |
|---|---|
| 0 | 16047 |
| 1 | 17901 |
| 2 | 12874 |
| 3 | 9133 |
| 4 | 6105 |
| 5 | 3666 |
| 6 | 1436 |
| 7 | 374 |
| 8 | 80 |
| 9 | 17 |
| 10 | 1 |
| 35 | 1 |
| 36 | 1 |
| 48 | 1 |
| 57 | 1 |
| 60 | 1 |
| 63 | 2 |

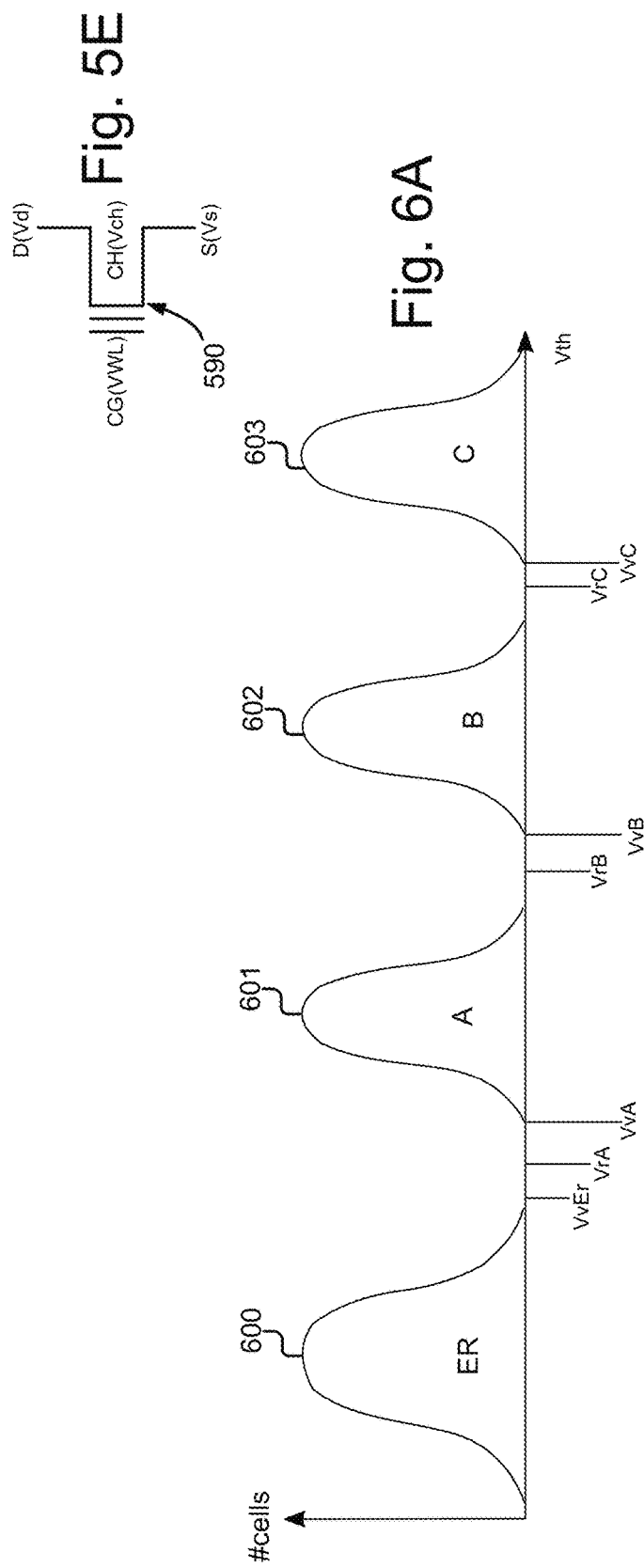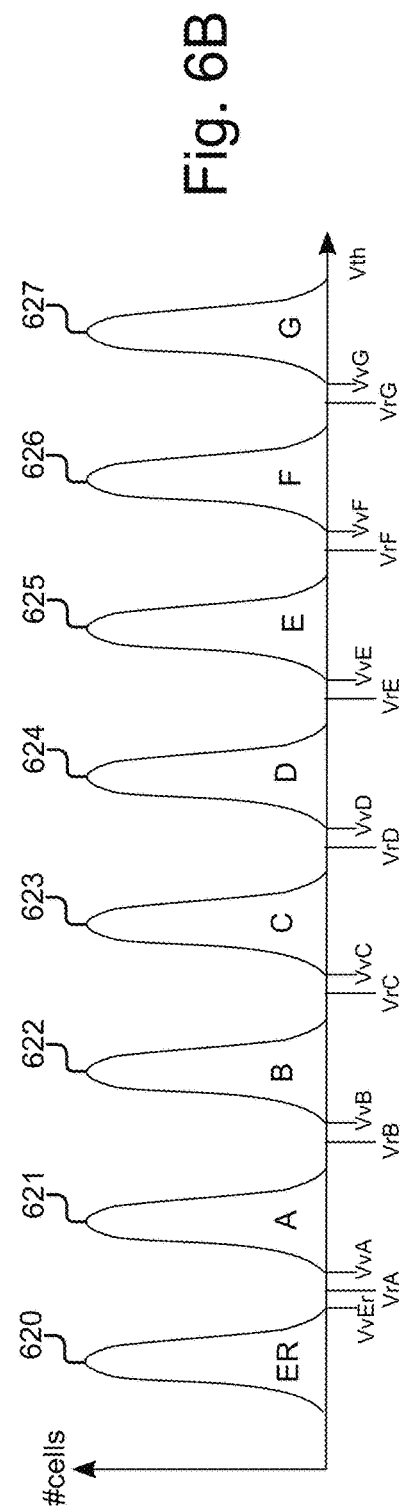

MITIGATING GROWN BAD BLOCKS

TECHNICAL FIELD

The present disclosure pertains generally to operation of memory devices, and more specifically to mitigating grown bad blocks in non-volatile memory devices.

BACKGROUND

Advances in the design and fabrication of 2D and 3D-NAND devices have revolutionized flash storage technology by stacking memory cells on top of each other to optimize usage of storage device real estate. This has led to significant increases in memory cell density and more precisely, storage capacity of modern flash storage devices.

Existing fabrication techniques for building 2D and 3D-NAND storage devices introduce structural and other design limitations that can negatively affect the operation of NAND storage devices. For example, the etching of memory strings/memory holes/memory channels (to which bit lines and source lines are coupled to) of 3D-NANDs results in a funnel-like shape for each memory string. When memory strings having this funnel-like shape are energized during either a program/erase operation associated with memory cells coupled to the memory string, a high electric stress can develop across such memory strings. This is highly undesirable since this high electric stress usually leads to word-line-memory-hole-shorts (i.e., grown bad blocks). Word-line-memory-hole-shorts do not only cause permanent program failure but also, cumulatively cause storage device failures.

SUMMARY

Apparatuses, methods, systems, and/or other aspects are presented for reducing occurrence of grown bad blocks (GBB) during an erase operation. One innovative aspect includes an apparatus comprising: a memory block comprising a set of memory cells of a memory channel. The memory channel comprises a first end electrically coupled to a substrate and a second end electrically coupled to a bit line. The set of memory cells includes a first memory cell coupled to a first word line and a second memory cell coupled to a second word line. The apparatus further comprises an erase circuit coupled to the set of memory cells. The erase circuit is configured to erase the first memory cell of the first word line for a first duration and erase the second memory cell of the second word line for a second duration, such that the first duration is different than the second duration.

Some implementations may optionally include one or more of the following features: that the first memory cell is located closer to the substrate along the memory channel than the second memory cell; that the first duration is less than the second duration; that the first memory cell comprises a first memory hole; that the second memory cell comprises a second memory hole; that a perimeter of the first memory hole is smaller than a perimeter of the second memory hole; that the memory block comprises a first zone comprising a first plurality of memory cells; that the first plurality of memory cells includes the first memory cell; that the memory block comprises a second zone comprising a second plurality of memory cells; that the second plurality of memory cells includes the second memory cell; that the erase circuit is further configured to erase the first zone for the first duration and erase the second zone for the second duration; a third memory cell coupled to a third word line; that the second memory cell is located closer to the substrate along the memory channel than the third memory cell; that the erase circuit is further configured to erase the third memory cell of the third word line for a third duration; that the third duration is different from the second duration and the first duration; that the third duration is longer than the second duration, and the second duration is longer than the first duration; that the apparatus further comprises a temperature sensor coupled to the erase circuit; that the temperature sensor is configured to detect a temperature associated with the memory block; and that the erase circuit is further configured to adapt one or more of the first duration and the second duration based on the temperature.

Another general aspect includes an apparatus comprising an erase circuit coupled to a set of memory cells of a memory channel. The erase circuit is configured to supply, during an erase operation, an erase voltage to the memory channel. Prior to an end of the erase operation, the erase circuit is configured to terminate an erase of a first memory cell of a first word line at a first termination time, and terminate an erase of a second memory cell of a second word line at a second termination time occurring later than the first termination time, such that the second word line is located above the first word line relative to a substrate.

Some implementations may optionally include one or more of the following features: that prior to the end of the erase operation, the erase circuit is further configured to terminate an erase of a third memory cell of a third word line at a third termination time, such that the third word line is located above the second word line; that the third termination time is longer than the second termination time, and that the second termination time is longer than the first termination time; that the erase circuit is further configured to adapt one or more of the first termination time and the second termination time based on a detected temperature of the set of memory cells; that the erase circuit is further configured to supply during the erase operation, the erase voltage to the memory channel; that prior to the end of the erase operation, the erase circuit is configured to terminate an erase of a first zone of the set of memory cells at the first termination time; that the first zone comprises one or more memory cells; that prior to the end of the erase operation, the erase circuit is configured to terminate an erase of a second zone of the set of memory cells at the second termination time; and that the second zone comprises one or more memory cells located above the first zone relative to the substrate.

Another general aspect includes a system comprising a first unit of memory cells connected to a first word line. The first unit of memory cells is associated with a plurality of memory channels. The system further comprises a second unit of memory cells connected to a second word line. The second unit of memory cells is associated with the plurality of memory channels. The system further comprises a control circuit coupled to the first unit of memory cells and the second unit of memory cells, such that the control circuit is configured to perform an erase operation on the first unit of memory cells and the second unit of memory cells. The control circuit comprises a row decoder circuit configured to select the first word line and the second word line for the erase operation. The control circuit further comprises an erase circuit configured to erase the first unit of memory cells of the first word line and the second unit of memory cells of the second word line using different erase pulse durations.

Some implementations may optionally include one or more of the following features: that the second word line is positioned further from a substrate than the first word line; that a third unit of memory cells is connected to a third word line, the third unit of memory cells associated with the plurality of memory channels; that the control circuit is coupled to the third unit of memory cells; that the control circuit is further configured to perform an erase operation on the third unit of memory cells by: selecting using the row decoder circuit, the third word line for the erase operation, and erasing using the erase circuit, the third unit of memory cells of the third word line for a duration that is longer than an erase pulse duration used to erase the second unit of memory cells; and that a temperature sensor is coupled to the erase circuit, such that the temperature sensor is configured to detect a temperature associated with the first unit of memory cells and the second unit of memory cells, wherein the erase circuit is further configured to adapt one or more of the different erase pulse durations based on the temperature.

Another general aspect includes a method comprising supplying, during an erase operation, an erase voltage to a memory channel. The memory channel includes a set of memory cells. Prior to an end of the erase operation, terminating an erase of a first memory cell of a first word line at a first termination time. The method further comprises terminating an erase of a second memory cell of a second word line at a second termination time occurring later than the first termination time, such that the second word line is located above the first word line relative to a substrate.

Some implementations may optionally include one or more of the following features: terminating an erase of a third memory cell of a third word line at a third termination time occurring later than the second termination time; that the third word line is located above the second word line relative to the substrate; that supplying the erase voltage comprises supplying an erase pulse to the first word line and to the second word line; and adapting one or more of the first termination time and the second termination time based on a detected temperature of the set of memory cells.

Note that the above list of features is not all-inclusive, and many additional features and advantages are contemplated and fall within the scope of the present disclosure. Moreover, the language used in the present disclosure has been principally selected for readability and instructional purposes, and not to limit the scope of the subject matter disclosed herein.

BRIEF DESCRIPTION OF THE DRAWINGS

FIG. 5E depicts an example memory cell.

FIG. 6A depicts an example threshold voltage (Vth) distribution of a set of memory cells in which four data states are used.

FIG. 6B depicts an example Vth distribution of a set of memory cells in which eight data states are used.

Figure 1:
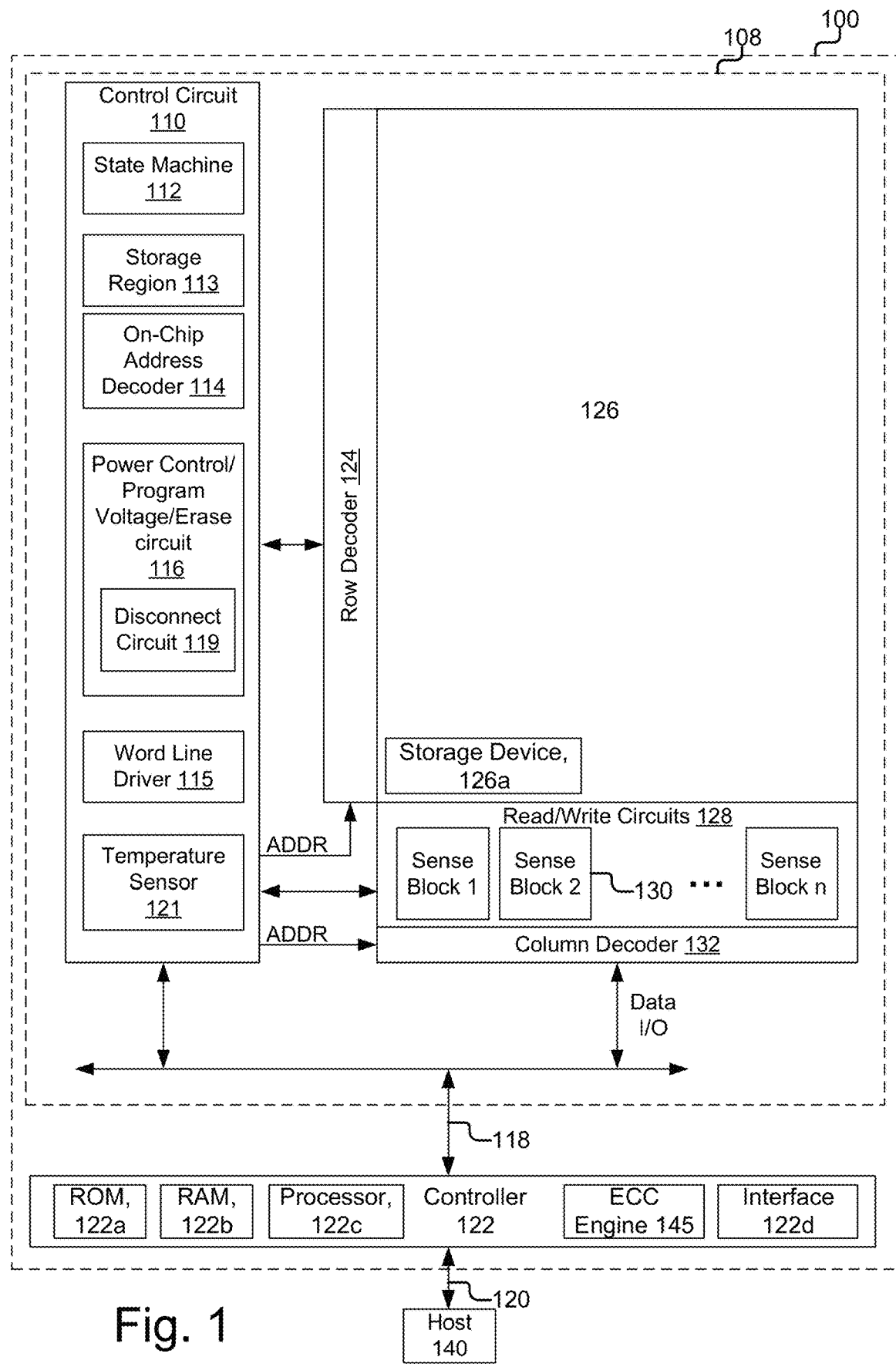
FIG. 1 is a block diagram of an example memory device.

The figures depict various implementations for purposes of illustration only. It should be understood that alternative implementations of the structures and methods illustrated herein may be employed without departing from the principles described herein.

DETAILED DESCRIPTION

Innovative technology, including various aspects such as apparatuses, processes, methods, systems, etc., is described for mitigating against grown bad block occurrence during an erase operation for a block of memory cells. In the following description, for purposes of explanation, numerous specific details are set forth to provide a thorough understanding of the various aspects of different example implementations. Note that any particular example implementation may in various cases be practiced without all of the specific details and/or with variations, permutations, and combinations of the various features and elements described herein.

As described in detail below, in some memory devices, a bit line provides a conductive path from an electrical source to a drain. In some cases, a set of memories cells comprising a bit line may be serially connected source-to-drain with one end coupled to the bit line and another end coupled to the source line, although other variations are also possible and contemplated. This set of memory cells may comprise a memory channel. The substrate may represent a material on which memory cells are stacked, and through which the substrate voltage (in some cases referred to as CPWELL, or the CPWELL voltage) may be supplied via the source line to the memory channel of a set of memory cells, such as a memory string, as discussed in further detail below with reference to FIG. 12.

By way of further non-limiting example, memory cells are may be joined to one another such as in NAND strings in a block or sub-block. Each NAND string includes a number of memory cells connected in series between one or more drain-side select gate transistors (SGD transistors), on a drain-side of the NAND string which is connected to a bit line, and one or more source-side select gate transistors (SGS transistors), on a source-side of the NAND string which is connected to a source line, although other variations are also possible and contemplated.

Further, the memory cells can be arranged with a common control gate line (e.g., word line) which acts as a control gate. A set of word lines extends from the source side of a block to the drain side of the block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells.

Memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of a memory block. The memory block, in some implementations, may be the smallest erasable unit of the memory device, as shown in FIG. 1, although other variations are also possible and contemplated. From the word line at the source side, the programming may proceed to the word line at the drain side of the memory block (simply referred to as block in some instances). In one approach, each memory cell of a word line is programmed before programming a next word line. For example, a first word line (e.g., WLL0 of FIG. 2) is programmed using one or more programming passes until the programming is completed. Next, a second word line (e.g., WLL1 of FIG. 2) is programmed using one or more programming passes until the programming is completed, and so forth.

Figure 7:
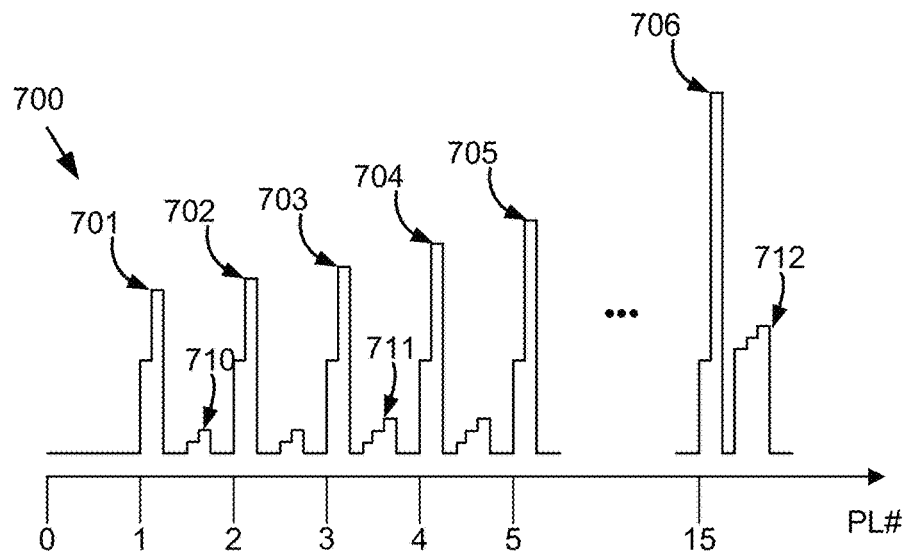
FIG. 7 depicts a waveform of an example programming operation.

A programming pass may include a set of increasing program voltages which are applied to the word line in respective program loops or program-verify iterations, such as depicted in FIG. 7. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data associated with a program command. Generally, a memory device includes memory cells which store words of user data as code words. Each code word includes symbols, and each data state represents one of the symbols. When a cell stores n bits of data, the symbols can have one of $2^n$ possible values. The data states include an erased state and one or more programmed states. A programmed state is a data state to which a memory cell is to be programmed in a programming operation. The symbol or data state which is to be represented by a cell is identified by one or more bits of write data in latches associated with the memory cell. This data state is the assigned data state. Each data state corresponds to a different range of threshold voltages (Vth). Moreover, a programmed state is a state which is reached by programming a memory cell so that its Vth increases from the Vth range of the erased state to a higher Vth range. Based on its assigned data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 6A). In a three-bit per cell memory device, there are eight data states including the erased state and seven higher data states referred to as the A, B, C, D, E, F and G data states (see FIG. 6B). In a four-bit per cell memory device, there are sixteen data states including the erased state and fifteen higher data states.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

The memory cells can be erased using an erase operation. An erase operation erases memory cells by resetting the memory cells to a programmable state. In some implementations, memory cells are erased together in groups referred to herein as blocks or memory blocks. For instance, in a non-limiting example, erasing the block involves boosting the channel voltage (Vch) while holding the control gates of the memory cells in the block at a low voltage, for example, 0-0.5 V. Various approaches can be used to boost the channel voltage. One approach raises the voltage of a substrate at a source end of the memory strings. In some implementations, when new data is to be written to a block, the block is erased by performing an erase operation.

In one implementation, the control gate voltage of a source side select gate transistor (SGS transistor) of each memory string is additionally controlled to allow holes (positive charges) to enter its channel. In some implementations, the substrate is the primary source of holes. The conduction of holes from the substrate charges up the channel and boosts the channel voltage. In another approach, a voltage can also be applied to the drain ends of the memory strings via bit lines, to help boost the channel voltage.

During an erase operation, CPWELL voltage can interact with word line voltages applied to word lines along the memory channel (e.g., memory channel 530 of FIG. 5A) to induce one or more electric fields across the channel. In some cases, an electric field develops at each instance of coupling between a specific word line and the memory channel during the erase operation. The one or more electric fields can be used to erase memory cells of the memory channel. In some instances, the nature of the memory channel (e.g., the vertical profile/shape of the memory channel) may cause the electric fields to be variable along the memory channel. For example, the memory channel of FIG. 5A may have a funnel-like shape tapering from top to bottom. The tapering may cause a stronger electric field to be induced at the narrower end (e.g., bottom around the word line WLL0) of the memory channel 530 than at the wider end (e.g., top around the word line WLL63) of the memory channel 530. The stronger electric field at the narrower end can cause shorting to occur in the word line and/or channel, as discussed further below.

Figure 5A:
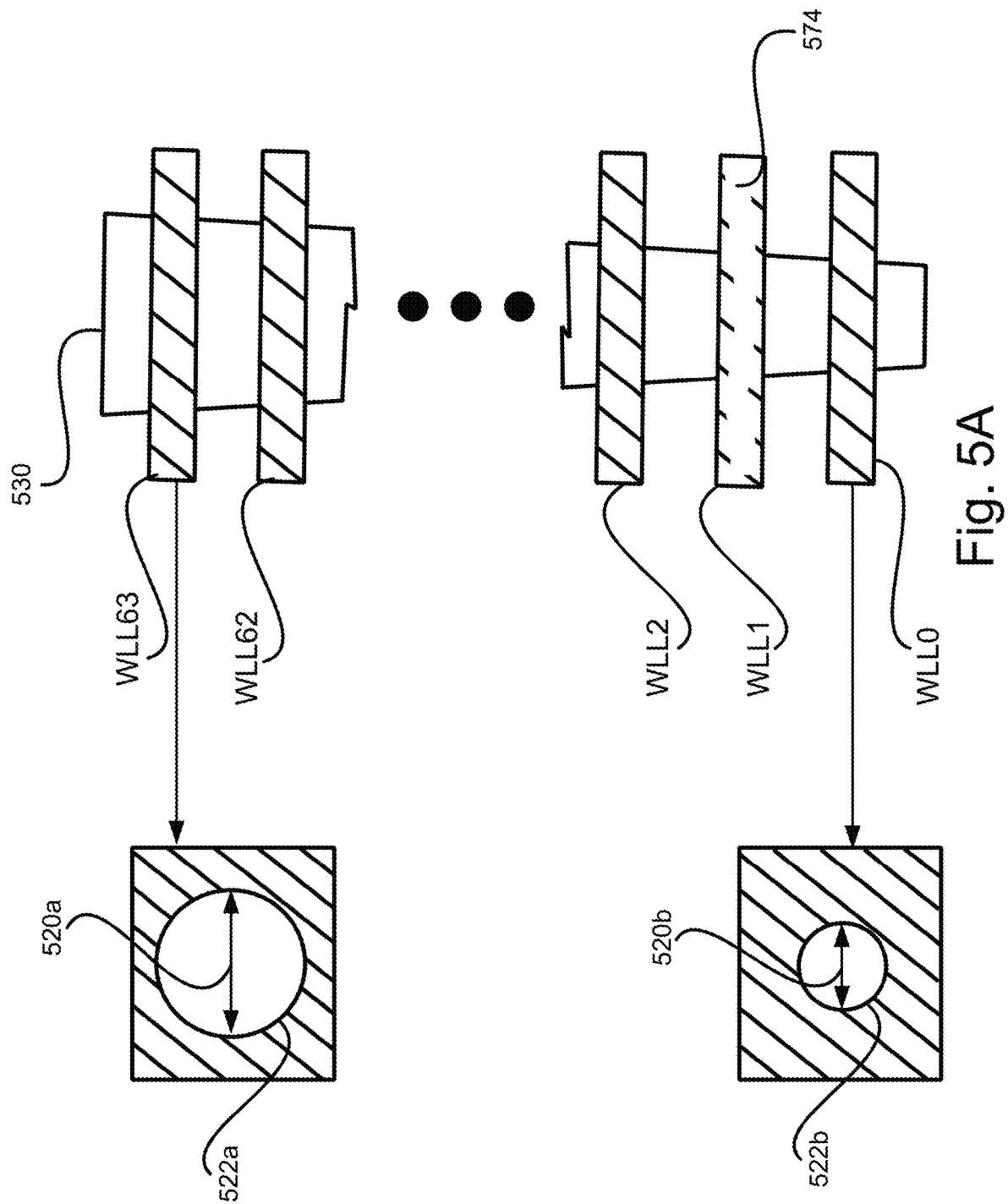
FIG. 5A depicts an example memory channel with word lines coupled to it.

A cross-sectional view of the memory channel 530 of FIG. 5A shows that the tapering of the memory channel results in the hole 522a with a larger diameter 520a at the top of the memory channel relative to the hole 522b with a smaller diameter 520b at the bottom of the memory channel. During an erase operation, the smaller perimeter hole 522b can cause a stronger electric field to develop at the bottom of the memory channel than at other points in the memory channel, such as at the top where the perimeter of the hole 522a is larger. The localized stronger electric field at smaller perimeter holes, such as the hole 522b, can create a high electric stress which may lead to word line-memory hole shorts (also referred to as grown bad blocks (GBBs)), such as memory hole short 574 (see also FIG. 5B).

Figure 5B:
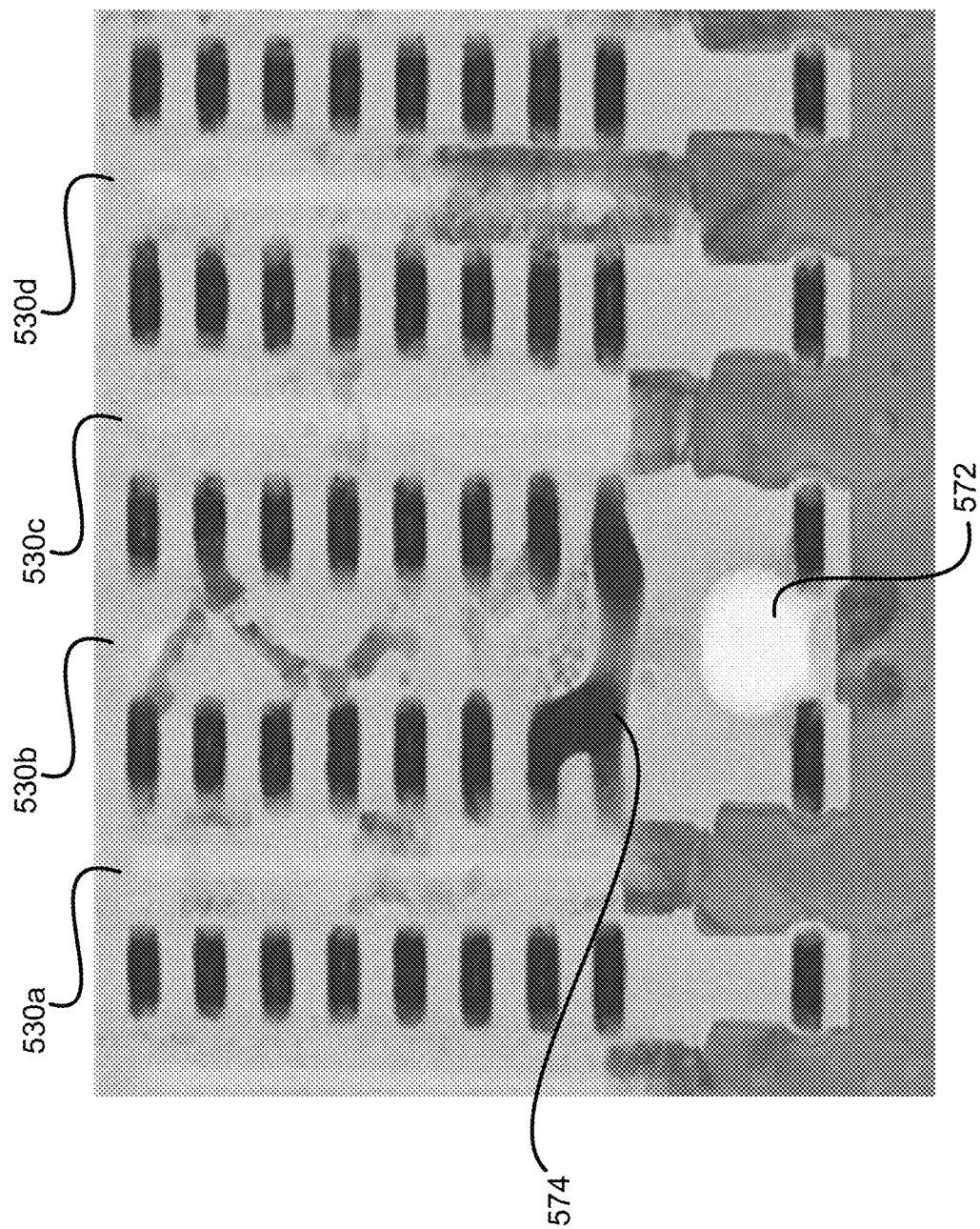
FIG. 5B depicts an example memory channel having a grown bad block.

In FIG. 5B, a GBB 574 can develop at the bottom of the memory channel 530b due to the high electric field 572 during an erase operation. Compared to the other "healthy" memory channels (such as, 530a, 530c, and 530d), the memory channel 530b is structurally damaged because of the GBB 574. This damage can cause a significantly elevated accumulated failure rate during cycling (e.g., on the order of 6×), and lead to memory device failure and/or storage irregularities including data loss and storage operation (program, read, write, etc.) failure.

Experimental results for GBBs occurring within memory channels 530 indicate that GBBs may have strong word line dependence (e.g., frequency of GBB occurrence may be a function of the location of a word line relative to other word lines coupled to a given memory hole). For instance, GBBs can be more likely to occur at lower word lines (e.g., WLL0 and WLL1 of FIG. 5A) than at higher word lines (e.g., WLL62 and WLL63 of FIG. 5A), as reflected in the bar chart 552 of FIG. 5C and the table 554 of FIG. 5D. The bar chart 552 shows a high GBB occurrence at lower word lines relative to GBB occurrence at higher word lines of memory channels 530. For example, the GBB count for word lines 0-1 for memory channels 530 observed is above 15000, whereas the GBB count for word lines 10 and above is less than or equal to 2. The table 554 provides actual numerical figures to further illustrate the word line dependence of GBBs mentioned above.

An existing approach to tackle the grown bad block issue is to reduce the erase voltage/erase pulse, which is also called a word line erase pulse elsewhere herein, that is applied to word lines associated with the memory string in order to mitigate the electric field(s) across the memory hole. However, such an approach is less desirable because, while it can reduce GBBs to a desired number, very low erase pulses applied to word lines often cannot fully erase a memory cell associated with the memory string. Additionally, a low voltage applied to word lines generally leads to unacceptable high bit error rates in memory devices.

In contrast to the above-noted existing approach, the novel technology disclosed herein addresses, among other things, the above noted GBB issues. In one aspect, the technology can terminate word line erase pulses early for word lines connected to the memory channel to mitigate against GBBs. Such architectures may require executing control logic (e.g., control circuit) that terminate erase pulses applied to word lines of the memory channel at different times. For example, the word line erase pulse applied to word lines located at higher electric field areas of the memory channel (e.g., at lower word line locations) may be terminated first before the erase pulse applied to word lines located at lower electric field areas of the memory channel (e.g., higher word line locations) are terminated.

The above early termination of word line erase pulses can be further modified to factor in the temperatures of the word lines and/or temperatures of memory cells of the memory channel. This is because the time to trigger early termination of the erase pulse for the word lines may be subject to environmental temperatures around the word lines of the memory channel. As such word lines (e.g., lower word lines) with higher temperatures due to the high electric field described above can have erase pulses terminated before word lines (e.g., higher word lines) with lower temperatures.

Another approach involves varying a boosting time for the erase pulse applied to word lines of the memory channel. With this technique, different boosting times of the erase pulse for different groups of word lines can be used to mitigate against GBBs. For example, the longest boosting times for erase pulses may be applied to lower word lines located at high electric field locations of the memory channel whereas lower boosting times for erase pulses can be applied to higher word lines located at low electric field locations of the memory channel.

Various other features and benefits of the technology are described below.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines (e.g., see FIG. 4, WLL0-WLL10, etc., for example) via a row decoder 124 and by bit lines (e.g., see FIG. 4, BL0, BL1, BL2, etc., for example) via a column decoder 132. The read/write circuits 128 include multiple sense blocks 130 from 1, 2, . . . , n (sensing circuitry) and allow a page of memory cells to be read or programmed in parallel. Typically, a controller 122 is included in the same memory device 100 (e.g., a removable storage card) as the one or more memory die 108. The controller 122 may be separate from the memory die 108. Commands and data are transferred between the host 140 and controller 122 via a data bus 120, and between the controller 122 and the one or more memory die 108 via lines 118.

The memory structure 126 can be multidimensional (e.g., 2D or 3D). The memory structure 126 may include one or more array of memory cells including a 3D array. The memory structure 126 may include a monolithic 3D memory structure in which multiple memory levels are formed above (and not in) a single substrate, such as a wafer, with no intervening substrates. The memory structure 126 may include any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

In some implementations, the memory structure 126 may comprise a set of memory cells comprising a memory channel. The memory channel may comprise a first end electrically coupled to a bit line, a second end electrically coupled to a substrate, and a select gate between the first end and second end. In some cases, the first end is a drain end of the set of memory cells and the second end is a source end of the set of memory cells. In some implementations, the set of memory cells may comprise a memory string that has a source end, a drain end, and a channel. The source end may be connected to a substrate, and the drain end may be connected to a bit line and a select gate transistor. The channel may include an ungated channel region extending between the select gate transistor and the bit line.

The control circuitry 110 cooperates with the read/write circuits 128 to perform memory operations on the memory structure 126. The control circuitry 110 includes a state machine 112, a storage region 113, an on-chip address decoder 114, and a power control/program voltage module 116 including a disconnect circuit 119. The state machine 112 provides chip-level control of memory operations. The storage region 113 may be provided, e.g., for operational parameters and software/code. In one implementation, the state machine is programmable by the software. In other implementation, the state machine does not use software and is completely implemented in hardware (e.g., electrical circuits).

The on-chip address decoder 114 provides an address interface between that used by the host 140 or a memory controller 122 to the hardware address used by the decoders 124 and 132. The power control module 116 controls the power and voltages supplied to the word lines, select gate lines, bit lines, source lines and substrate during memory operations. It can include drivers for word lines, bit lines, SGS and SGD transistors and source lines.

In some implementation, the power control module 116 may comprise various sub-components for controlling various elements of the memory structure 126, such as, but not limited to, a bit line driver configured to control the voltages of the bit lines; a source line driver configured to control the voltage of the substrate; a word line driver configured to control the voltages associated with the word lines, control gate voltages, etc. It should be understood, however, that these sub-components may be combined into other components of the control circuitry 110, or may be implemented as separate components included in the control circuitry 110 that are configured to carry out the same or similar functionality and acts as the power control module 116 described herein.

In some instances, the power control module 116 may embody an erase circuit configured to perform erase operations at various intervals.

In some implementation, the erase circuit may include the bit line driver, source line driver, disconnect circuit, word line driver, and/or other components, and may control the word lines, bit lines, SGS and SGD transistors and source lines during an erase operation. The source line driver may be configured to raise a voltage of the substrate in relation to a change in the voltage of the bit line controlled by the bit line driver, which charges up the memory channel to an erase voltage threshold. The charging of the memory channel may be done is such a way that a channel potential gradient of the memory channel between the bit line and the select gate transistor stays below a predetermined threshold when the memory channel charges up. Stated another way, the timing of the change in the voltage of the substrate and the voltage of the bit line as controlled by the power control module 116 may control the charging of the memory channel in such a way that the channel potential gradient is maintained (e.g., on average, strictly, etc.) below a level where significant electron injection occurs.

The raising of the voltage in relation to the change in the voltage of the bit line charges up the memory channel to an erase voltage threshold in a way where the channel potential gradient of the memory channel between the bit line and the select gate transistor stays below a predetermined threshold when the memory channel charges up. Keeping the gradient substantially below the threshold (e.g., 90% or better) is advantageous as the predetermined threshold may represent a level where electrons become injected into an upper region of the memory structure 126 and cause erase or programming issues, as discussed in further detail below. It should be understood that the predetermined threshold may be different for different memory structure 126 types, and may vary/be configurable depending on the implementation.

In some implementations, the erase circuit may be coupled to a memory string comprising a memory channel, and may be configured to control the charging of the memory channel by controlling the voltage of the bit line and the substrate. For instance, the erase circuit may decrease a voltage of a bit line at a drain end of the memory string from a reference voltage level to a negative voltage level; increase a voltage of a substrate at a source end of the memory string from a reference voltage level up to an intermediate voltage level in a first stage and increase the voltage of the substrate from the intermediate voltage level to an erase voltage threshold in a second stage to charge up the memory channel; and float the voltage of the bit line such that the floating voltage of the bit line couples up from the negative voltage level to the voltage of the substrate resulting in a potential gradient in an ungated channel region between the bit line and a select gate transistor at the drain end staying below the erase voltage threshold when the memory channel charges up to the erase voltage threshold, as described further elsewhere herein. In some cases, the erase circuit is configured to increase the voltage of the substrate from the reference voltage level to the erase voltage threshold in the first stage, and/or is configured to hold the voltage of the bit line at the reference voltage level and to float the voltage of the bit line from the reference voltage level.

In some implementations, the bit line driver may comprise and/or be coupled to the disconnect circuit 119, which may be configured to (e.g., responsive to receiving an instruction from the bit line driver or the power control module 116) disconnect a bit line to float the voltage of the bit line such that the floating voltage of the bit line couples up to the voltage of the substrate. In this example, the source line driver may be configured to raise the voltage of the substrate to the erase voltage threshold in one or more voltage steps in relation to the floating voltage of the bit line to maintain the channel potential gradient of the memory channel below the predetermined threshold.

In some further implementations, the bit line driver may be configured to drive the voltage of the bit line from a first level to a second level, where the second level is lower than the first level, and/or the source line driver may be configured to drive up the voltage of the substrate from a reference voltage level to the erase voltage threshold. In these implementations, the disconnect circuit may be configured to disconnect the bit line to float the voltage of the bit line from the second level.

In some further implementations, the bit line driver may be configured to drive the voltage of the bit line at a first level, where the first level is a reference voltage level. In these implementations, the source line driver may be configured to drive up the voltage of the substrate from a reference voltage level to an intermediate voltage level at a first time, and to drive up the voltage of the substrate from the intermediate voltage level to the erase voltage threshold at a second time, the second time being later than the first time. The disconnect circuit may be configured to disconnect the bit line to float the voltage of the bit line from the first level at the second time.

In some further implementations, a word line driver 115 (also referred to as WL_sel elsewhere herein) may be configured to hold control gate voltages of the memory cells at levels capable of erasing the memory cells in relation to the charging up, by the erase circuit 116, of the voltage of the memory channel to the erase voltage threshold. Referencing FIG. 9A for example for an erase operation, the erase voltage/erase pulse 908 may be applied by the erase circuit 116 to the memory channel 530 while a WL_sel pulse/voltage 906 may be simultaneously applied to word lines (e.g., word line 906) using the word line driver. The erase pulse 908 may have a higher maximum value than the WL_sel pulse 906. For example, during the erase operation, the erase pulse 908 could reach a maximum value of 12.6 V whereas the WL_sel pulse 906 could reach only 0.5 V. Simultaneously applying erase voltages 908 to the memory channel 902 and word line voltages 906 to the word lines coupled to the memory channel can cause electric fields to develop along the memory channel at word line locations, electric fields used to erase the memory cells of the memory channel.

In some implementations, a temperature sensor 121 of the control circuitry 110 may detect word line temperatures along the memory channel and factor the detected temperature into adapting an amount of time a WL_sel pulse is expected to take. This is further discussed with reference to the flowchart of FIG. 12.

In some cases, the power control module 116 may drive the bit line prior to and/or alternatively to floating the bit line. For example, the bit line driver may be configured to drive the voltage of the bit line up from an initial voltage level in one or more voltage steps toward a voltage level of the substrate, and the source line driver may be configured to raise a voltage of the substrate in relation to a change in the voltage of the bit line controlled by the bit line driver to maintain the channel potential gradient of the memory channel below the predetermined threshold. Other implementations are also possible and contemplated.

The sense blocks 130, which are discussed with reference to FIG. 13, can include bit line drivers, in some implementations. In one implementation, the power control module 116 includes disconnect circuit 119. The disconnect circuit 119 can be used to disconnect the bit line of a memory string from a driven voltage so that the voltage of the bit line floats and couples to the voltage of the substrate. In one implementation, the power control module 116 including the disconnect circuit 119 can be used to implement the techniques described herein including the processes of FIG. 10.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114, 124 and 132, power control/program voltage module 116, disconnect circuit 119, sense blocks 130, read/write circuits 128, controller 122, and so forth.

The controller 122 (which in one implementation is an electrical circuit and may in some cases be an off-chip controller) may comprise a processor 122c, storage devices (memory) such as ROM 122a and RAM 122b and an error-correction code (ECC) engine 145. The ECC engine 145 can correct a number of read errors.

A memory interface 122d may also be provided. The memory interface 122d, in communication with ROM 122a, RAM 122b, and processor 122c, is an electrical circuit that provides an electrical interface between controller 122 and memory die 108. For example, the memory interface 122d can change the format or timing of signals, provide a buffer, isolate from surges, latch I/O and so forth. The processor 122c can issue commands to the control circuitry 110 (or any other component of the memory die 108) via the memory interface 122d.

A storage device 126a of the memory structure 126 includes code such as a set of instructions, and the processor 122c is operable to execute the set of instructions to provide the functionality described herein. Alternatively or additionally, the processor 122c can access code from the storage device 126a of the memory structure 126, such as a reserved area of memory cells in one or more word lines.

For example, code can be used by the controller 122 to access the memory structure 126, such as for programming, read and erase operations. The code can include boot code and control code (e.g., a set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms/pulses including those discussed further below. A control circuit can be configured to execute the instructions to perform the functions described herein.

In one implementation, the host 140 is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host 140 may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some implementations include a resistivity switching storage element, such as an anti-fuse or phase change material, and optionally a steering element, such as a diode or transistor. Further by way of non-limiting example, active semiconductor memory elements include EEPROM and flash memory device elements, which in some implementations include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It should be understood that this technology is not limited to the 2D and 3D exemplary structures described but covers all relevant memory structures within the spirit and scope of the technology as described herein.

Figure 2:
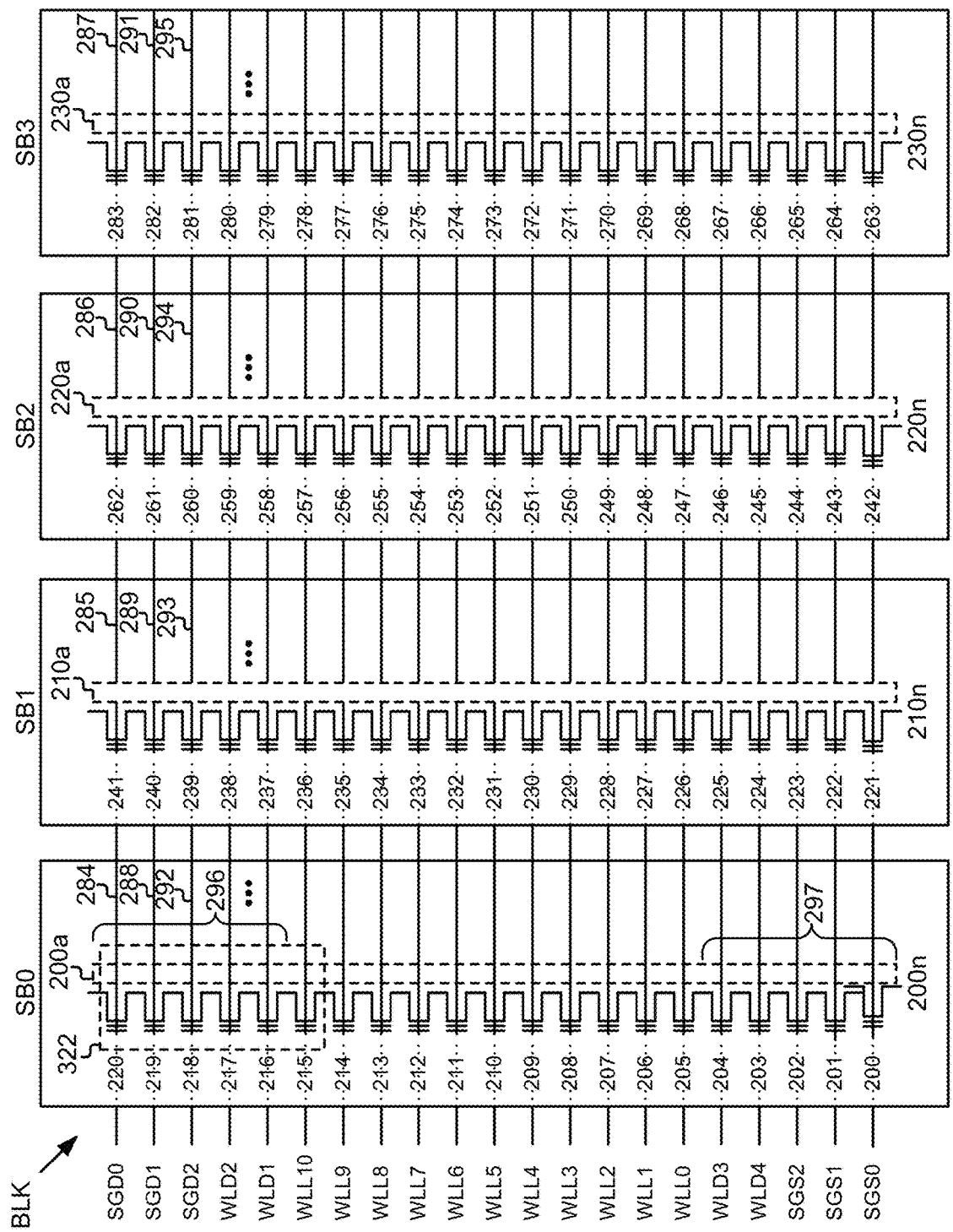
FIG. 2 depicts an example implementation of a memory structure of FIG. 1.

FIG. 2 depicts an example implementation of the memory structure 126 of FIG. 1 including NAND strings in sub-blocks in a 3D configuration. In one approach, a block BLK of memory cells is formed from a stack of alternating conductive and dielectric layers. The block includes conductive layers spaced apart vertically, and the conductive layers spaced apart vertically include word lines connected to the memory cells and select gate lines connected to SGD (drain-side select gate) and SGS (source-side select gate) transistors. An SGS transistor is a select gate transistor at a source end or source side of a NAND string, and an SGD transistor is a select gate transistor at a drain-end or drain side of a NAND string. In this example, the conductive layers include three SGD layers, three SGS layers and four dummy word line layers (or word lines) WLD1, WLD2, WLD3 and WLD4, in addition to data word line layers (or word lines) WLL0-WLL10. Although not shown, the dielectric layers include DL0-DL21. Each NAND string may be formed in a memory hole in the stack filled with materials which form memory cells adjacent to the word lines. A region 322 of the stack is shown in greater detail in FIG. 3.

Further, each block can be divided into sub-blocks and each sub-block includes multiple NAND strings, where one example NAND string is depicted. For example, sub-blocks SB0, SB1, SB2 and SB3 comprise example NAND strings 200n, 210n, 220n and 230n, respectively. The NAND strings have data word lines, dummy word lines, and select gate lines. Each sub-block includes a set of NAND strings which extend in the x direction and which have a common SGD line. SB0 has SGD lines or SGD layer portions 284, 288, and 292 in the SGD0, SGD1, and SGD2 layers, respectively. SB1 has SGD layer portions 285, 289, and 293 in the SGD0, SGD1, and SGD2 layers, respectively. SB2 has SGD layer portions 286, 290, and 294 in the SGD0, SGD1, and SGD2 layers, respectively. SB3 has SGD layer portions 287, 291, and 295 in the SGD0, SGD1, and SGD2 layers, respectively. Each of the data word line layers WLL0 to WLL10 and the SGS layers SGS0, SGS1, and SGS2 is shared by the sub-blocks SB0 to SB3. The dummy word line layers are also shared by the sub-blocks.

The NAND strings 200n, 210n, 220n and 230n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 200n, 210n, 220n and 230n have channels 200a, 210a, 220a and 230a, respectively. Each channel has a drain end and a source end. For example, the channel 200a has a drain end 296 and a source end 297.

Additionally, NAND string 200n includes SGS transistors 200, 201, and 202, dummy memory cells 203 and 204, data memory cells 205, 206, 207, 208, 209, 210, 211, 212, 213, 214 and 215, dummy memory cells 216 and 217, and SGD transistors 218, 219, and 220.

NAND string 210n includes SGS transistors 221, 222, and 223, dummy memory cells 224 and 225, data memory cells 226, 227, 228, 229, 230, 231, 232, 233, 234, 235, and 236, dummy memory cells 237 and 238, and SGD transistors 239, 240, and 241.

NAND string 220n includes SGS transistors 242, 243, and 244, dummy memory cells 245 and 246, data memory cells 247, 248, 249, 250, 251, 252, 253, 254, 255, 256, and 257, dummy memory cells 258 and 259, and SGD transistors 260, 261, and 262.

NAND string 230n includes SGS transistors 263, 264, and 265, dummy memory cells 266 and 267, data memory cells 268, 269, 270, 271, 272, 273, 274, 275, 276, 277, and 278, dummy memory cells 279 and 280, and SGD transistors 281, 282, and 283.

Figure 3:
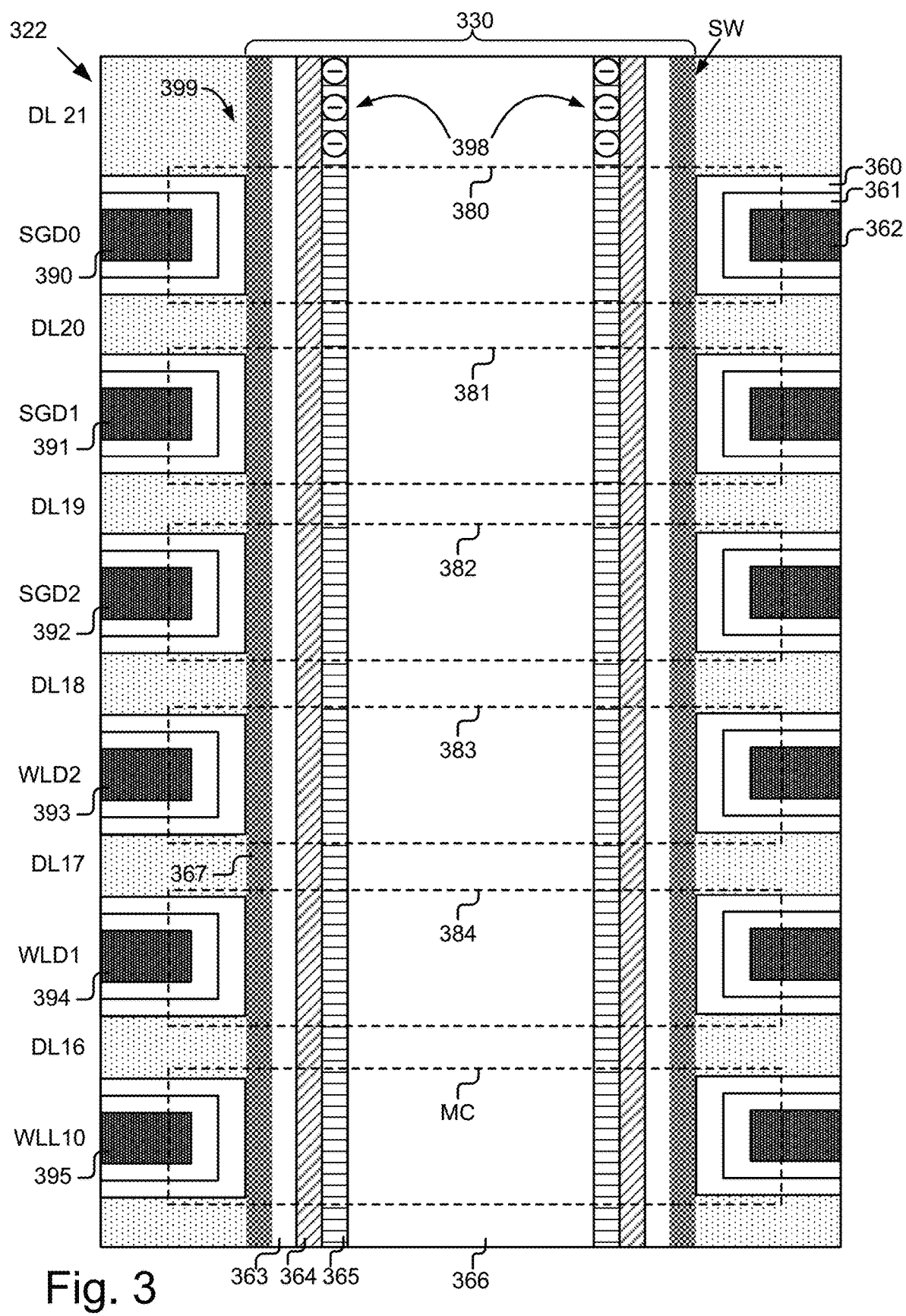
FIG. 3 depicts a close-up view of a region of FIG. 2.

FIG. 3 depicts a close-up view of the region 322 of FIG. 2. Memory cells are formed at the different levels of the stack at the intersection of a word line layer and a memory hole. In this example, SGD transistors 380, 381, and 382 are provided above dummy memory cells 383 and 384 and a data memory cell MC. A number of layers can be deposited along the sidewall (SW) of the memory hole 330 and/or within each word line layer, e.g., using atomic layer deposition. For example, each pillar 399 or column which is formed by the materials within a memory hole 330 can include a blocking oxide 367, a charge-trapping layer 363 or film such as silicon nitride (Si3N4) or other nitride, a tunneling layer 364, a channel 365 (e.g., comprising polysilicon), and a dielectric core 366. A word line layer can include a blocking oxide/block high-k material 360, a metal barrier 361, and a conductive metal 362 such as Tungsten as a control gate. For example, control gates 390, 391, 392, 393, 394, and 395 are provided. In this example, all of the layers except the metal are provided in the memory hole 330. In other approaches, some of the layers can be in the control gate layer. Additional pillars are similarly formed in the different memory holes. The pillar 399 can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack and separated from one another by a dielectric layer.

Figure 4:
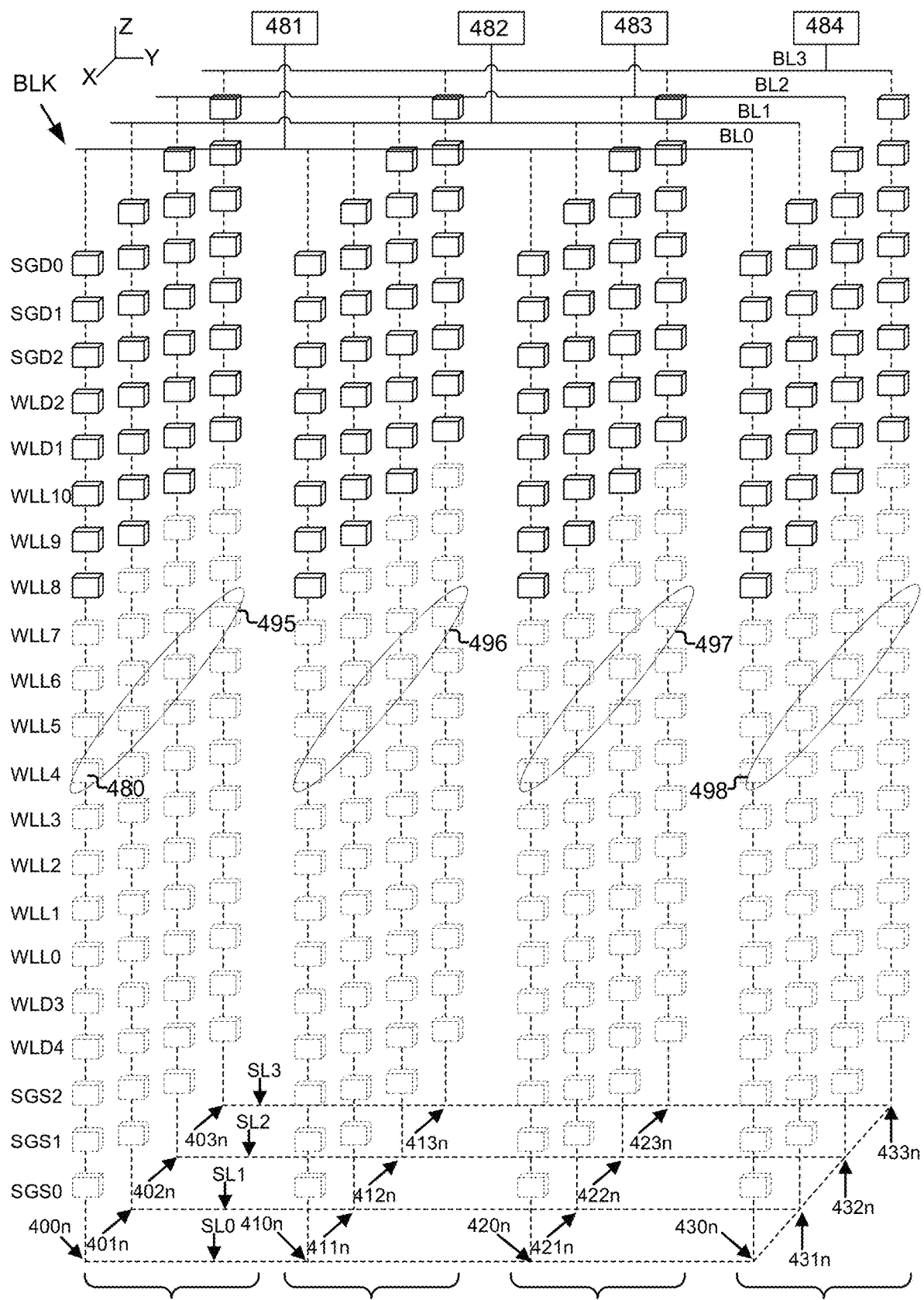
FIG. 4 depicts a further perspective view of the sub-blocks of FIG. 2.

FIG. 4 depicts a further perspective view of the sub-blocks SB0-SB3 of FIG. 2. A sub-block is a portion of a block and represents a set of memory strings which are programmed together and which have a common SGD line. Also, each memory string in a sub-block is connected to a different bit line, in one approach.

Example memory cells are depicted which extend in the x direction along word lines in each sub-block. Each memory cell 480 is depicted as a cube for simplicity. SB0 includes NAND strings 400n, 401n, 402n and 403n. SB1 includes NAND strings 410n, 411n, 412n and 413n. SB2 includes NAND strings 420n, 421n, 422n and 423n. SB3 includes NAND strings 430n, 431n, 432n and 433n. Bit lines are connected to sets of NAND strings. For example, a bit line BL0 is connected to NAND strings 400n, 410n, 420n and 430n, a bit line BL1 is connected to NAND strings 401n, 411n, 421n and 431n, a bit line BL2 is connected to NAND strings 402n, 412n, 422n and 432n, and a bit line BL3 is connected to NAND strings 403n, 413n, 423n and 433n. Sensing circuitry may be connected to each bit line. For example, sensing circuitry 481, 482, 483 and 484 are connected to bit lines BL0, BL1, BL2 and BL3, respectively. The NAND strings are examples of vertical memory strings which extend upward from a substrate.

Programming and reading can occur for selected cells of one word line and one sub-block at a time. This allows each selected cell to be controlled by a respective bit line and/or source line. For example, an example set 495 of memory cells (including an example memory cell 480) in SB0 is connected to WLL4. Similarly, the sets 496, 497 and 498 include data memory cells in SB1, SB2 and SB3 are connected to WLL4. In this example, the source lines SL0-SL3 are connected to one another and driven by a common voltage source.

In another approach, the source lines SL0-SL3 can be separate from one another and driven at respective voltages by separate voltage sources.

FIG. 5A depicts an example memory channel 530 with word lines coupled to it. The memory channel 530 tapers from top to bottom hence, has a wider diameter 520a at the top and a smaller diameter 520b at the bottom due to the tapering. Word lines WLL0-WLL63 are each coupled to at least a memory cell 590 (see FIG. 5E) of the memory channel. The memory cell 590 includes a control gate CG which receives a word line voltage Vwl, a drain at a voltage Vd, a source at a voltage Vs, and a channel at a voltage Vch.

Figures 5C, 5D:
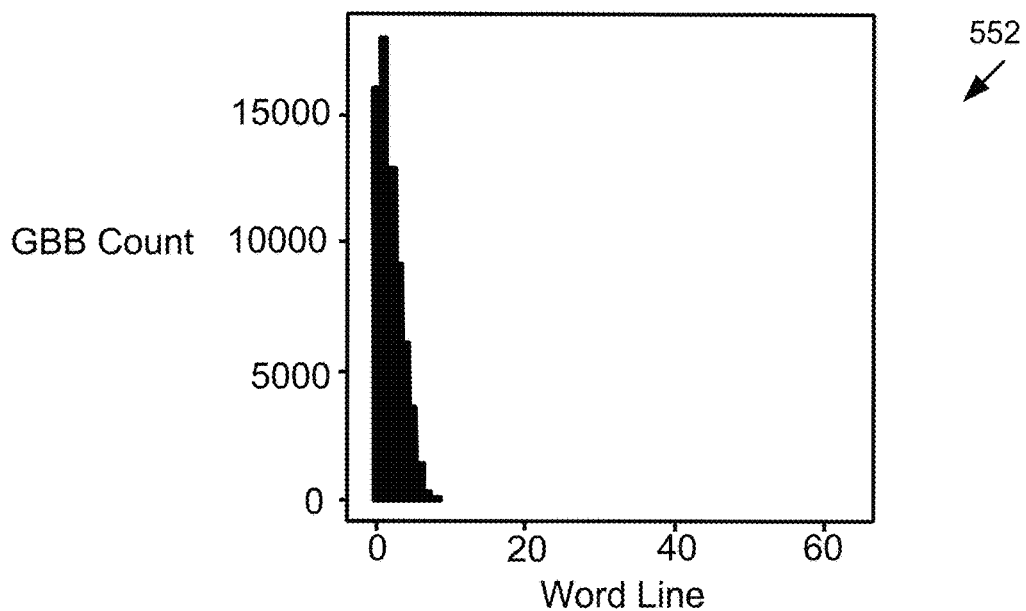
FIG. 5C depicts an example bar chart showing the dependence of GBB occurrence on locations of word lines of a memory channel.
FIG. 5D depicts an example table showing the dependence of GBB occurrence on location of word lines of a memory channel.

FIGS. 5B-5D show test results of word line dependence on GBB occurrence.

FIG. 6A depicts an example threshold voltage (Vth) distribution of a set of memory cells in which four data states are used. The set of memory cells may be connected to a common word line. The Vth distribution is obtained after a programming operation. A Vth distribution 600 is provided for erased (Er) state memory cells. Three Vth distributions 601, 602, and 603 represent assigned data states A, B and C, respectively, which are reached by memory cells when their Vth exceeds the erase-verify voltage VvA, VvB or VvC, respectively. In another approach, a single verify voltage is used which is common to the different assigned data states. This example uses four data states. Other numbers of data states can be used as well, such as eight or sixteen. The optimum read voltages generally are midway between the Vth distributions of adjacent data states. Read voltages VrA, VrB and VrC are used to read data from a set of cells having this Vth distribution. Each read voltage demarcates a lower boundary of a data state of a plurality of data states. For example, VrA demarcates a lower boundary of the A state. An erase-verify voltage VvEr is used in an erase-verify test to determine whether the erase operation is completed.

A programming operation can use one or more programming passes. A one pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass. After the programming pass is completed, the data can be read from the memory cells using read voltages which are between the Vth distributions. At the same time, a read pass voltage, Vpass (e.g., 8-10 V), is applied to the remaining word lines. By testing whether the Vth of a given memory cell is above or below one or more of the read reference voltages, the data state represented by a memory cell is determined. These voltages are demarcation voltages because they demarcate between Vth ranges of different data states.

FIG. 6B depicts an example Vth distribution of a set of memory cells in which eight data states are used. For the Er, A, B, C, D, E, F and G states, we have Vth distributions 620, 621, 622, 623, 624, 625, 626 and 627, respectively. For the Er, A, B, C, D, E, F and G states, we have program-verify voltages VvA, VvB, VvC, VvD, VvE, VvF and VvG, respectively, in one possible approach. In another approach, a single verify voltage is used which is common to the different assigned data states. For the Er, A, B, C, D, E, F and G states, we have read voltages VrA, VrB, VrC, VrD, VrE, VrF and VrG, respectively. An erase-verify voltage VvEr is used during an erase operation.

FIG. 7 depicts a waveform 700 of an example programming operation. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages.

Each program voltage includes two steps, in one approach. Further, Incremental Step Pulse Programming (ISPP) is used in this example, in which the program voltage steps up in each successive program loop using a fixed or varying step size. This example uses ISPP in a single programming pass in which the programming is completed. ISPP can also be used in each programming pass of a multi-pass operation.

The waveform 700 includes a series of program voltages 701, 702, 703, 704, 705 . . . 706 that are applied to a word line selected for programming and to an associated set of non-volatile memory cells. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 710) may be applied after each of the program voltages 701 and 702. A-, B- and C-state verify voltages of VvA, VvB and VvC (waveform 711) may be applied after each of the program voltages 703 and 704. After several additional program loops, not shown, E-, F- and G-state verify voltages of VvE, VvF and VvG (waveform 712) may be applied after the final program voltage 706.

Figure 8A:
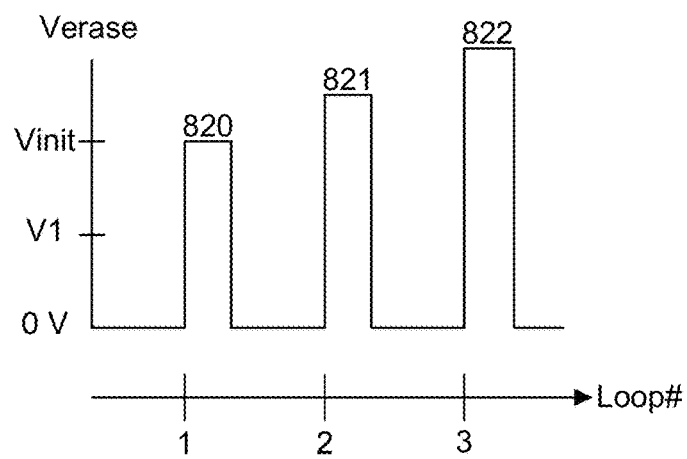
FIG. 8A depicts a plot of erase voltages in an example erase operation.

FIG. 8A depicts a plot of erase voltages in an example erase operation. The erase voltages can be applied to the source end of a set of memory strings via a substrate (CPWELL). When the bit lines float, the erase voltages can be coupled to the drain end of the set of memory strings via the bit lines. The erase voltages can be applied to the substrate via a local interconnect. The vertical axis depicts Verase (VERA) and the horizontal axis depicts the erase loop number. Verase has an initial magnitude of Verase1 and steps up in magnitude in each successive erase loop, e.g., to Verase2, Verase3 and so forth. Three loops are shown as an example. Erase voltages 820, 821 and 822 are applied in the erase loops 1, 2 and 3, respectively. Verase1, Verase2, Verase3 and so forth is the peak voltage applied to the substrate and/or bit line in an erase loop.

Figure 8B:
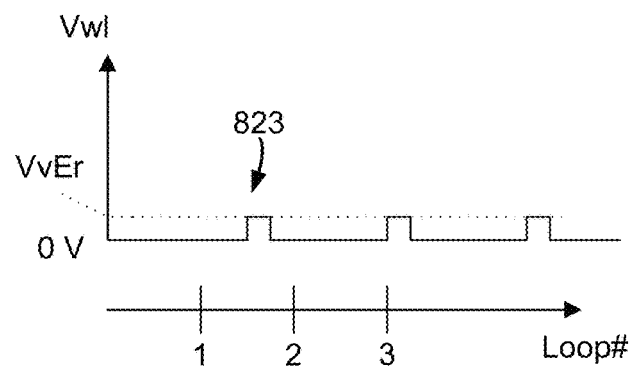
FIG. 8B depicts a plot of erase-verify voltages applied to word lines in a block.

FIG. 8B depicts a plot of erase-verify voltages applied to word lines in a block. The vertical axis depicts Vwl (word line voltage) and the horizontal axis depicts the erase loop number. An example erase-verify voltage 823 is depicted. This voltage (VvEr) may have a magnitude near 0 V, for example. An erase-verify voltage is typically applied after each erase voltage as part of an erase-verify test of a block.

Figure 9A:
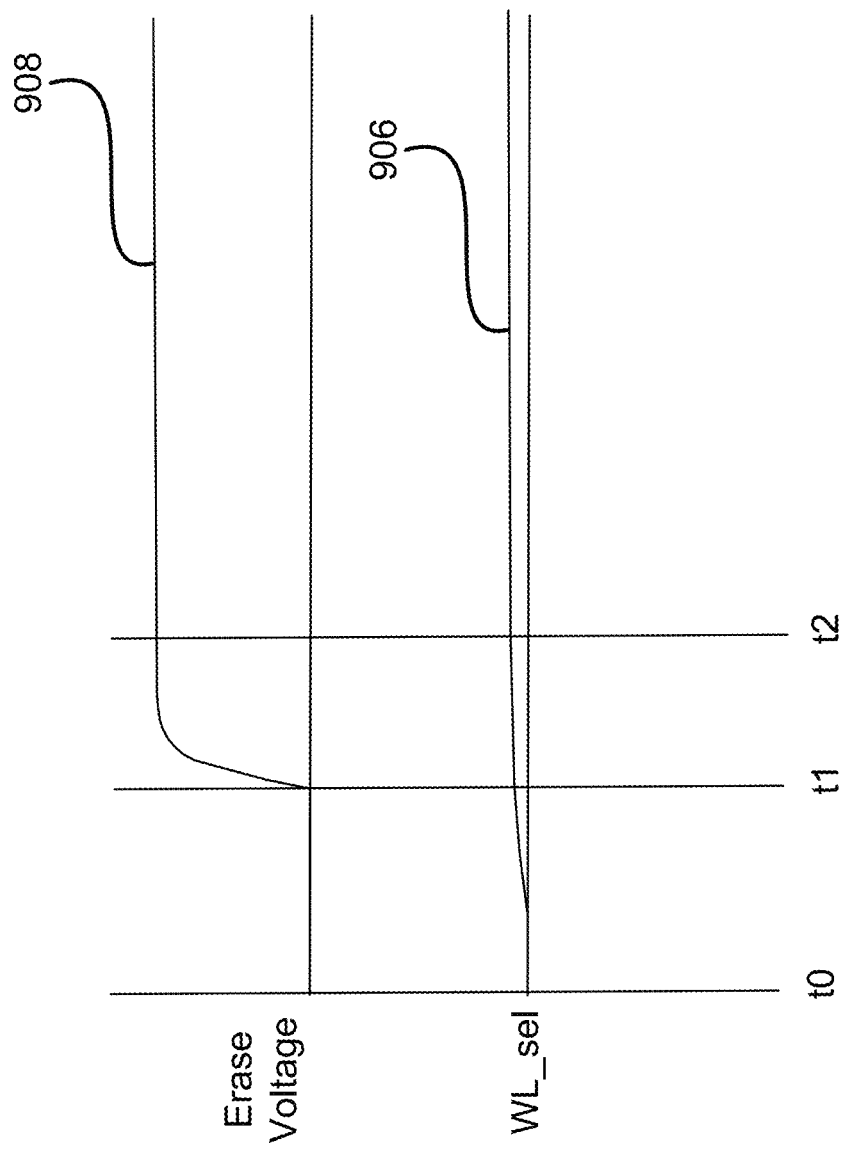
FIG. 9A depicts a plot of example waveforms/pulses applied to the memory channel and to the word lines during an erase operation.

FIG. 9A depicts a plot of example waveforms/pulses applied to the memory channel and to the word lines during an erase operation. The horizontal axis denotes time whiles the vertical axis denotes voltage. The erase voltage 908 and the WL_sel pulse (erase voltage applied to word lines) 906 are simultaneously applied during the erase operation. These pulses are discussed with reference to the word line driver 115 and the erase circuit 166 discussed in association with FIG. 1.

Figure 9B:
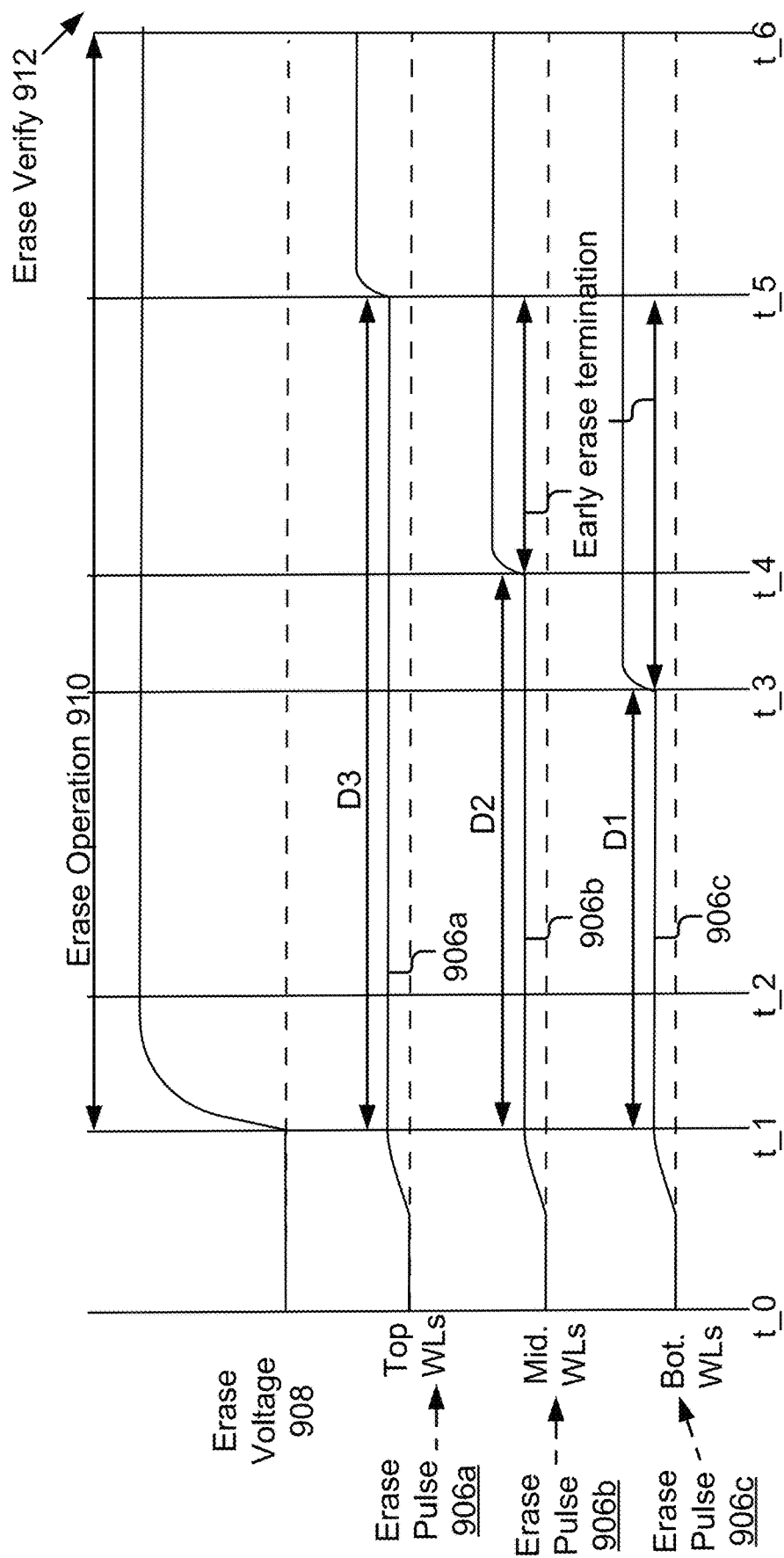
FIG. 9B depicts a plot of example pulses for executing early termination of word line erase pulses during an erase operation to mitigate against GBBs.

FIG. 9B depicts a plot of example pulses by an erase circuit to erase memory cells located on different word lines based on their location along a memory channel. In this example, a memory block may comprise a set of memory cells of a memory channel. The memory channel may have a first end that is electrically coupled to a substrate configured to deliver a source voltage (also called channel voltage elsewhere herein) and a second end electrically coupled to a bit line. The set of memory cells may comprise a series of memory cells that are coupled to a corresponding series of word lines. For example, a first memory cell may be coupled to a first word line, a second memory cell may be coupled to a second word line, as so forth, and the erase circuit may be configured to erase the first memory cell of the first word line for a first duration, and erase the second memory cell of the second word line for the second duration (that is different from the first duration), and so forth.

Beneficially, by erasing the memory cells of a memory channel for different durations, or in other words, terminating erase pulses of different word lines at different times during an erase operation, the erase circuit can mitigate against grown bad blocks (GBBs). By way of further illustration, the vertical axis of the graph shown in FIG. 9B represents voltage whiles the horizontal axis represents time. The word lines of the memory channel are grouped into different groups based on their relative location along the memory channel. Three example groups of word lines (top WLs, middle WLs, and bottom WLs) are depicted. The erase circuit 116 respectively applies different erase pulses 906a, 906b, and 906c to the different groups of word lines (bottom WLs, middle WLs, and top WLs), while simultaneously applying an erase voltage 908 to the bit line of the memory channel during the erase operation 910.

More particularly, as further shown in FIG. 9B, during the erase operation, the erase circuit 116 applies the erase voltage 908 to the channel 530 in conjunction with applying word line erase pulses 906 to the word lines. The erase voltage 908 may be provided to the channel 530 from one or both ends (e.g. at the substrate or at an end opposite the substrate). Generally, during an erase operation, an erase pulse is initiated on the word lines of an erase block at about the same time. In certain embodiments, the length or duration of the word line erase pulse 906 varies per word line or per group of word lines. For example, the erase circuit applies word line erase pulse 906c to the bottom WL(s) for a duration D1 (which extends from time t_1 to t_3); applies the word line erase pulse 906b to the middle WLs for a duration D2 (which extends from time t_1 to t_4); and applies the word line erase pulse 906c to the top WLs for a duration D3 (which extends from time t_1 to t_5). Thus, the erase pulse 906c terminates earlier than the erase pulses 906b and 906a, and the erase pulse 906b terminates earlier than the erase pulse 906a, and so forth. Responsive to the erase operation 910 completing at t_6, the control circuitry 110 can verify 912 the erase operation 910 for memory cells of the memory channel from t_6 onwards.

This approach beneficially and effectively mitigates the electric field, especially at the low word line areas of the memory channel, thus minimizing the electric stress along the memory channel. Indeed, because of the non-uniform electric field along the memory channel due to tapering of the memory channel introduced during fabrication, different termination times for erase pulses can be applied to the different word lines of the memory channel to create electric field uniformity along the memory channel. One advantage of such a technique is that the hardware or layout of the memory die 108 need not be changed for already fabricated memory dies. Rather, the control circuitry 110 and/or the controller 122 can be configured to include logic that varies the timing of the word line voltages to significantly reduce GBB occurrence. Additionally, this variable termination of erase pulses applied by WL_sel 906 can be further modified to factor in the temperatures of the word lines of the memory channel. This is discussed with reference to FIG. 12.

Figure 9C:
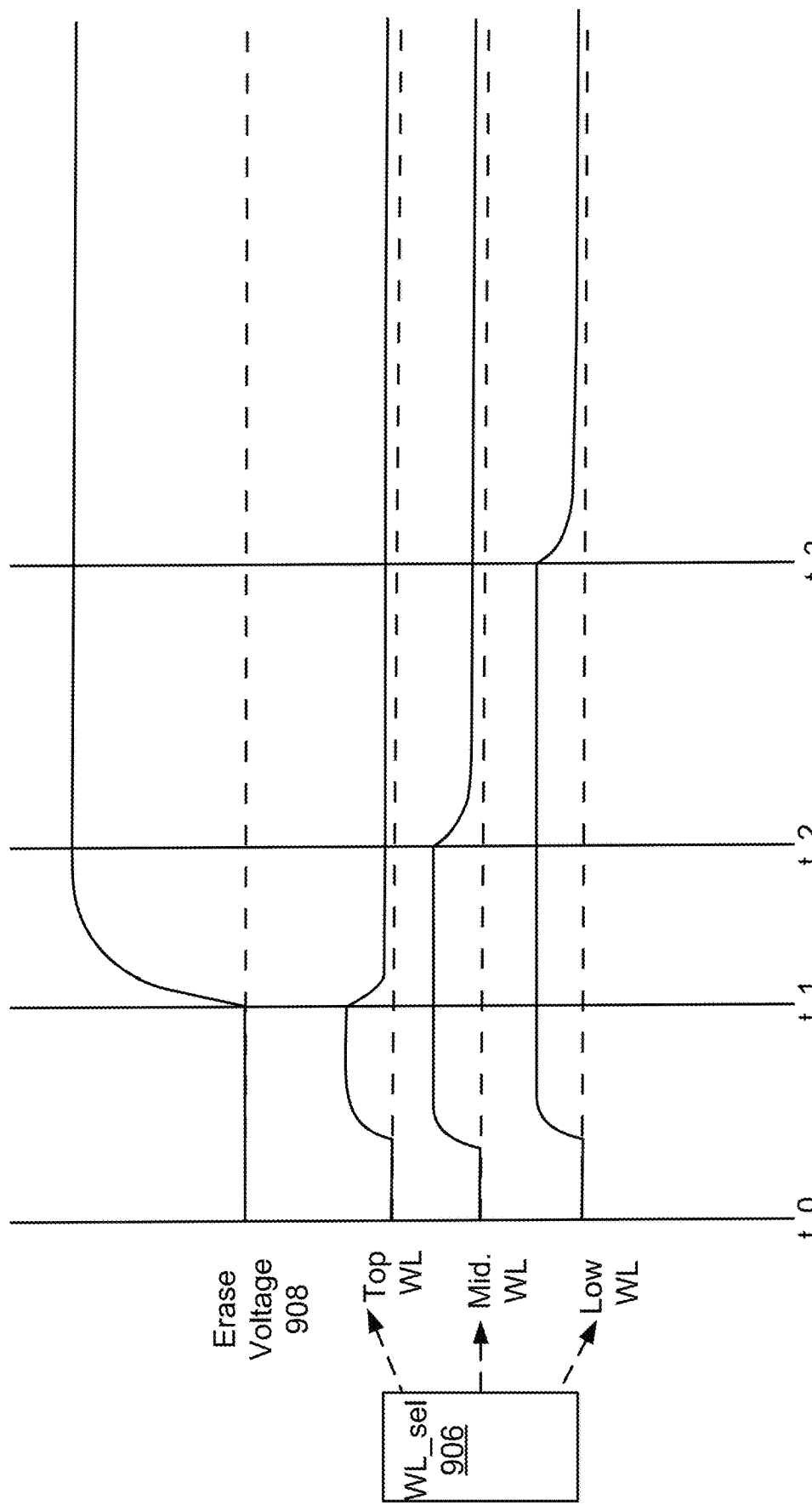
FIG. 9C shows a VERA boosting technique for mitigating against GBBs.

FIG. 9C shows a VERA boosting technique for mitigating against GBBs. With this approach, WL_sel 906 boosts the erase pulse applied to the word lines of the memory channel for different durations/amounts of time during an erase operation. Typically, the longest boosting time of the erase pulse 906 is needed for the low WL which has the smallest diameter due to tapering resulting from fabrication. For example, WL_sel 906 can boost the erase pulse applied to the top WL for t 1 units of time, boost the erase pulse for the mid WL for t 2 units of time, and boost the erase pulse for the low WL for t 3 units of time. After each boosting of the erase pulse for the appropriate amount of time, the erase pulse applied to the word lines may be reduced to a normal value for the rest of the erase operation. For instance, the word line erase pulse may be boosted to 5V for each word line before being normalized to about 0.5 V. Like the early termination method discussed above, the erase voltage 908 applied to the memory channel remains the same and is generally higher (e.g., 12V) as compared to the boosted word line erase pulse 906 (e.g., 5V) and the normalized erase voltage (e.g., 0.5V).

Figure 10:
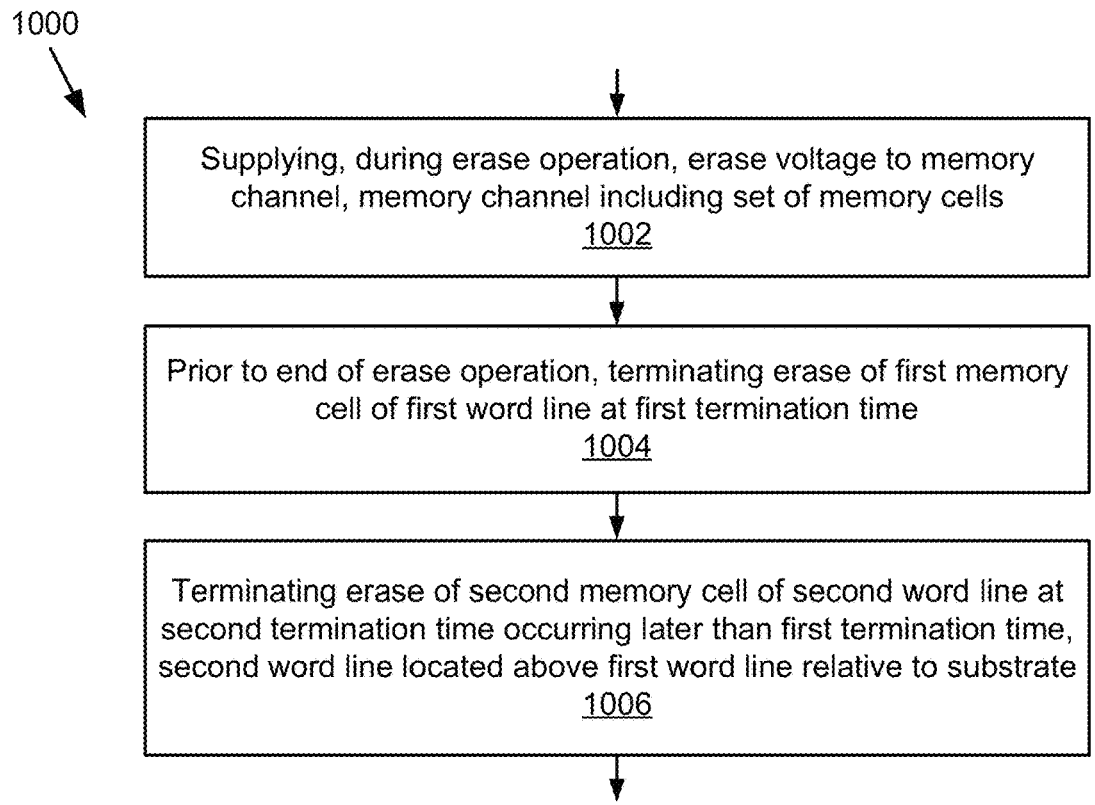
FIG. 10 depicts an example process for performing an erase operation using the early terminate technique for word line pulses.

FIG. 10 depicts an example process 1000 for performing an erase operation using the early terminate technique for word line pulses. Step 1002 begins an erase operation for a set of memory cells in a memory string/channel. The erase operation may involve a multiplicity of memory strings/channels including a set of memory cells in a memory block for instance. At this step, the control circuitry 110 may supply an erase voltage to the memory channel. As shown in FIGS. 9A and 9B, the control circuitry 110 may additionally supply, in association with the erase voltage, one or more erase pulses to word lines of the memory channel.

Prior to an end (e.g., a completion time) of the erase operation, the control circuitry 110 may, at step 1004, terminate an erase of a first memory cell of a first word line at a first termination time. As used herein, terminating an erase of a given memory cell may refer to changing an erase voltage level being applied to the memory cell in a way that stops or inhibits erasure of the memory cell from occurring. Any suitable method or technique for terminating or inhibiting the erase of the memory cell may be applicable, such as, but not limited to, cutting off the voltage applied to the memory cell, ramping down the voltage being applied to the memory cell over time, settling the voltage of the memory cell to a threshold or range, stopping a biasing of a word line (e.g., allowing the word line to float) associated with the memory cell, etc.

As used herein, an erase termination time (also simply called a termination time) may refer to time at which the erase of a given memory cell is terminated or an erase effect is inhibited, and should be understood to encompass any of the foregoing methods or techniques for terminating or inhibiting the erase of the memory cell, such as, but not limited to, the time at which the erase voltage being applied to the memory cell is cut off, the time at which a ramp-down of the voltage of the memory cell has begun or ended, the time at which the voltage has settled to a threshold or range, the time at which the biasing of the word line has stopped, etc.

By way of example, the first termination time may represent an end time of a first duration during which the erase pulse 906c is applied to the first word line. For instance, referencing FIG. 9B, the first word line may be the bottom WL, the first duration may be D1, and the first termination time may be t_3. Step 1006 includes terminating an erase of a second memory cell of a second word line at a second termination time occurring later than the first termination time, where the second word line is positioned above the first word line relative to a substrate. The second termination time may represent an end time of a second duration during which the erase pulse 906*b* is applied to the second word line. Again, referencing FIG. 9B, the second word line may be the mid WL, the second duration may be D2, and the second termination time may be t_4. As seen in FIG. 9B, because D1<D2, D1 is different from D2.

Continuing the above, in some implementations in which a third memory cell is coupled to a third word line, and the second memory cell is located closer to the substrate along the memory channel than the third memory cell, the erase circuit may be further configured to erase the third memory cell of the third word line for a third duration that is different from the second duration and the first duration. For instance, as shown in FIG. 9B, the third duration may be longer than the second duration (e.g., D3<D1), although other variations are also possible and contemplated.

In some implementations, the word lines of a given memory string may be grouped into zones that can be selectively erased based on different termination times or different durations as discussed above. For example, a first set of word lines coupled to the memory channel may be grouped into a first zone; a second set of word lines coupled to the memory channel may in turn be grouped into a second zone; a third set of word lines coupled to the memory channel may also be grouped into a third zone; etc. In such instances, the first set of word lines, the second set word lines, and the third set of word lines are different from each other. For instance, the low WL, mid WL, and top WL of FIG. 9 may respectively represent the first zone, the second zone and the third zone. With such an architecture, the low WL would comprise the first set of word lines, the mid WL would comprise the second set of word lines, and the top WL would comprise the third set of word lines.

In some implementations, the memory cells of the memory device 100 may be grouped into units of memory cells that can be selectively erased based on different termination times or different durations as discussed above using different word lines. As used herein, a unit of memory cells may refer to one or more pluralities of memory cells that respectively represent one or more memory cell groups that can be erased by the erase circuit during an erase operation. For example, the system for implementing the method of FIG. 10 may include a first unit of memory cells associated with a plurality of memory channels of the memory device and coupled to a first word line. A second unit of memory cells associated with the plurality of memory channels of the system may in turn be coupled to a second word line. The system could further include a third unit of memory cells, fourth unit of memory cells, and so forth, associated with the plurality of memory channels and respectively coupled to a third word line, a fourth word line, etc. Such architectures may use a row decoder circuit (e.g., row decoder 124 of FIG. 1) to select the first word line, the second word line, the third word line, etc., in order to respectively erase the first unit of memory cells, the second unit of memory cells, the third unit of memory cells, etc., using different erase pulse durations. For instance, the erase decoder may erase: a) the first unit of memory cells for a first erase pulse duration (e.g., a period in which the erase pulse is applied), b) the second unit of memory cells for a second erase pulse duration, c) the third unit of memory cells for a third duration, and so forth. As discussed above, the first, second, third, etc. erase pulse durations may be different to account for the corresponding differences in width of the memory channel at the first, second, and third, etc., word lines.

Figure 11:
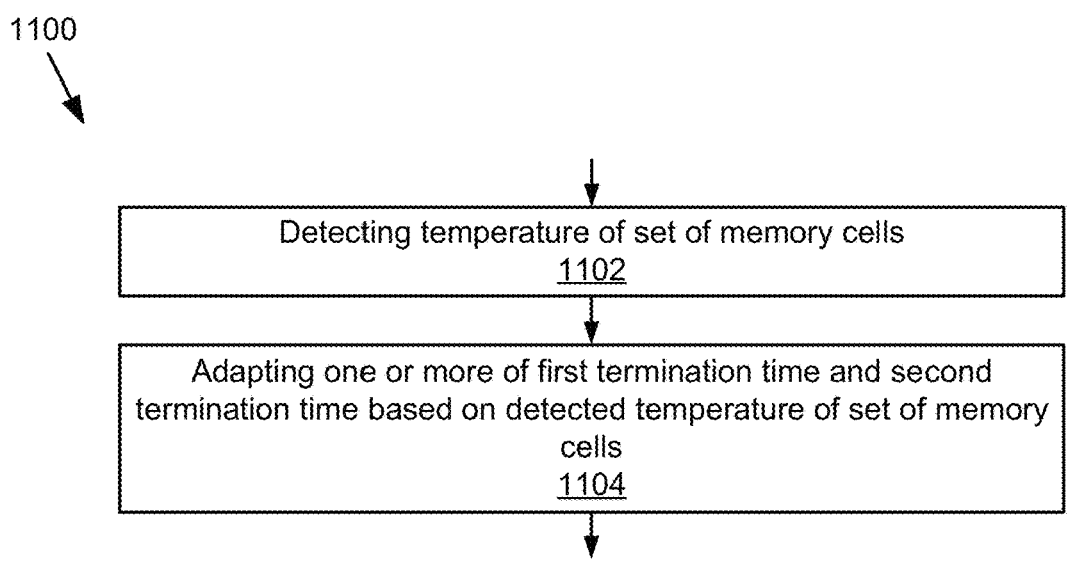
FIG. 11 depicts an example process for performing an erase operation incorporating the temperature of word lines of a memory channel.

FIG. 11 depicts an example process 1100 for performing an erase operation incorporating the temperature of word lines of a memory channel. At step 1102, the temperature sensor 121 detects a temperature of a set of memory cells of the memory channel. In some instances, the temperature may be detected by reading, via the temperature sensor 121, the temperature at each word line coupled to the memory channel. Responsive to detecting the temperature, the control circuitry 110 may adapt (e.g., vary, alter, configure, etc.), during the erase operation, one or more of a first termination time and the second termination time based on the detected temperature of the set of memory cells. The process described in FIG. 11 may be applicable to the erase technique described in FIG. 9 in that after detecting the temperature of the memory cells, the highest temperature, which typically occur at the lower word line locations along the memory string, indicates that the erase pulse should be terminated first, for example, for the low WL, followed respectively by terminating the erase pulse applied to the mid WL and the top WL.

Figure 12:
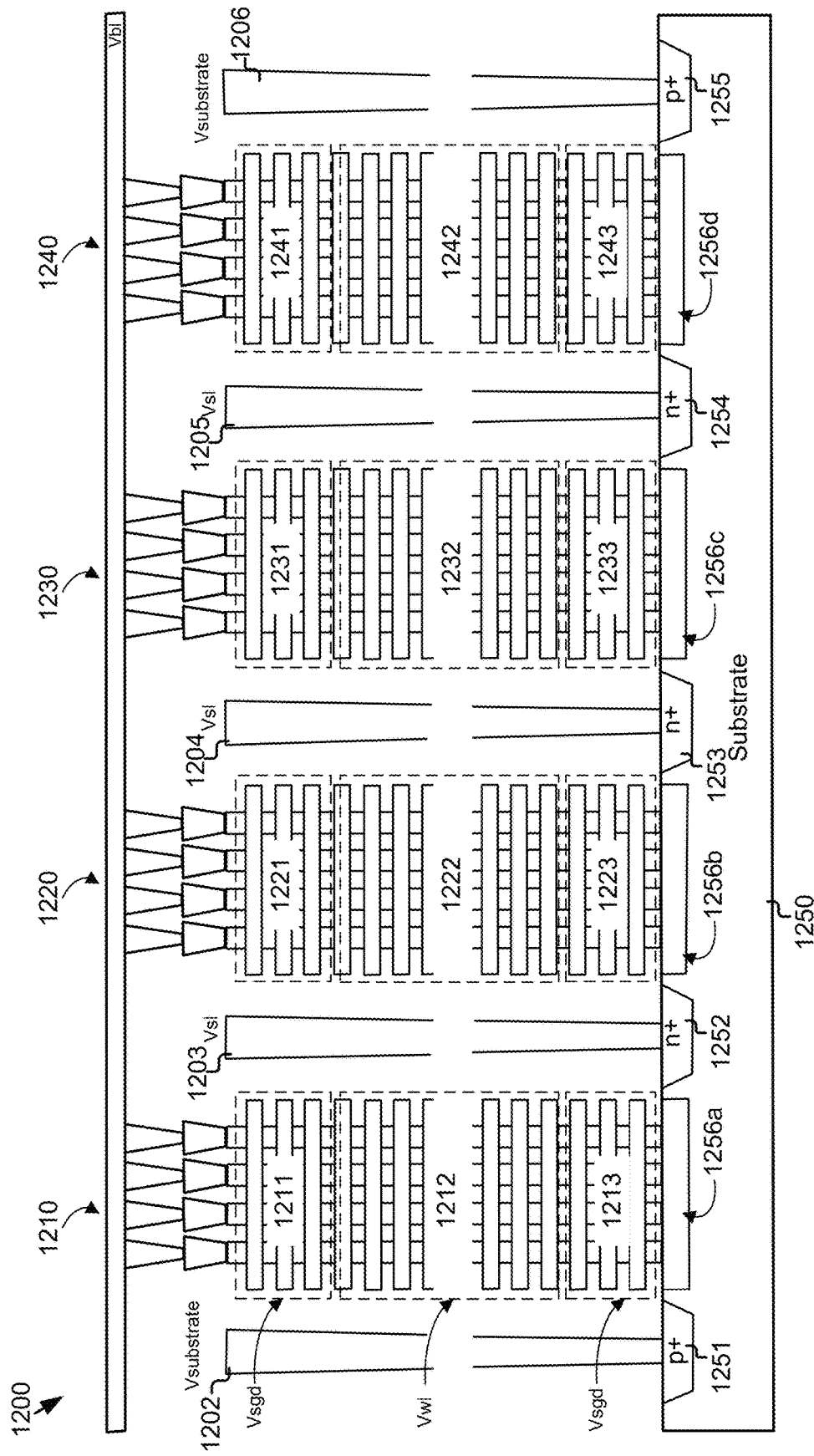
FIG. 12 depicts an example configuration of a memory device during an erase operation.

FIG. 12 depicts an example configuration of a memory device 1200 during an erase operation. The memory device 1200 is arranged in groups 1210, 1220, 1230 and 1240. Each group includes a top portion comprising drain-side select gate transistors and dummy memory cells, a middle portion comprising data-storing word lines and a bottom portion comprising source-side select gate transistors and dummy memory cells. Groups 1210, 1220, 1230 and 1240 include top portions 1211, 1221, 1231 and 1241, respectively, middle portions 1212, 1222, 1232 and 1242, respectively, and bottom portions 1213, 1223, 1233 and 1243, respectively. In this example, group 1210 is selected for erase, so that Vsg is applied to each control gate in the top portion 1211 and bottom portion 1213 and Vwl is applied to each control gate in the middle portion 1212. Groups 1220, 1230 and 1240 are not selected for erase, so that the select gate transistors and dummy memory cells can be in a non-conductive state, with 0 V applied on their control gates, or with floating voltages, for example.

The groups are formed on a CPWELL 1250 of a substrate, where the CPWELL includes p+ regions 1251 and 1255 connected to vias 1202 and 1206, respectively, which receive a voltage Vsubstrate. The CPWELL also includes n+ regions 1252, 1253 and 1254 connected to vias 1203, 1204 and 1205, respectively, which receive a source line voltage Vsl. A top portion 1256 of the CPWELL may be doped n-type to improve cell current. For example, a portion 1256*a* of the n-type region provide a current path between the source ends of the NAND strings in the group 1210 and the via 1203. Controlling the erase voltage waveform and the bit line waveform as described herein allows the erase operation to be carried out while avoiding electron injection on the drain side of the select gate transistors in the NAND strings.

Figure 13:
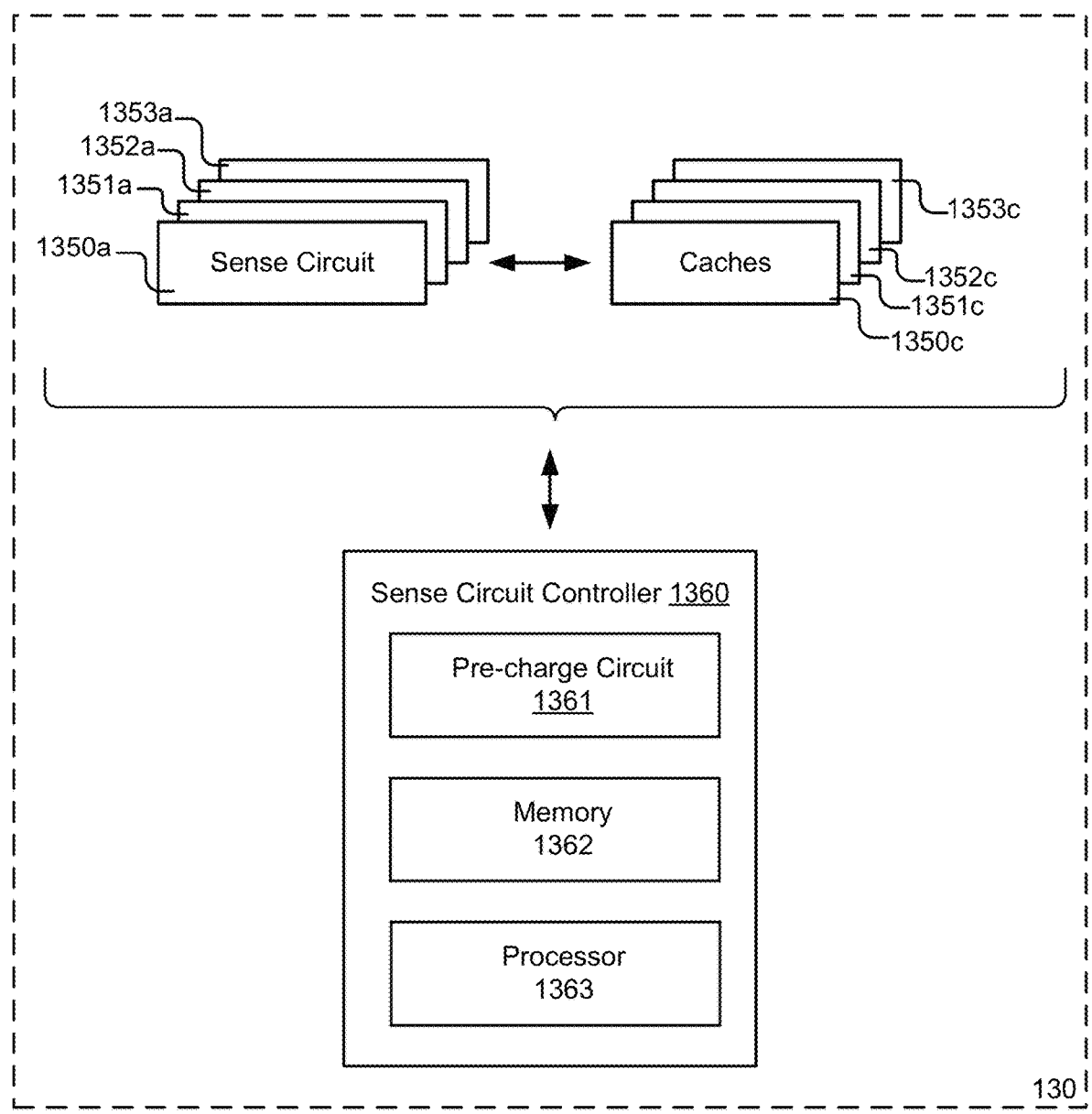
FIG. 13 depicts an example block diagram of a sense block in the column control circuitry of FIG. 1.

FIG. 13 depicts an example block diagram of a sense block 130 in the column control circuitry of FIG. 1. The column control circuitry can include multiple sense blocks, where each sense block performs sensing, e.g., read, program-verify or erase-verify operations for multiple memory cells via respective bit lines.

In one approach, a sense block 130 comprises multiple sense circuits, also referred to as sense amplifiers. Each sense circuit is associated with data latches and caches. For example, the example sense circuits 1350*a*, 1351*a*, 1352*a* and 1353*a* are associated with caches 1350*c*, 1351*c*, 1352*c* and 1353*c*, respectively.

In one approach, different subsets of bit lines can be sensed using different respective sense blocks. This allows the processing load which is associated with the sense circuits to be divided up and handled by a respective processor in each sense block. For example, a sense circuit controller 1360 can communicate with the set, e.g., sixteen, of sense circuits and latches. The sense circuit controller may include a pre-charge circuit 1361 which provides a voltage to each sense circuit for setting a pre-charge voltage. The sense circuit controller may also include a memory 1362 and a processor 1363.

Further example details of the sense circuit controller and the sense circuits are provided below.

Figure 14:
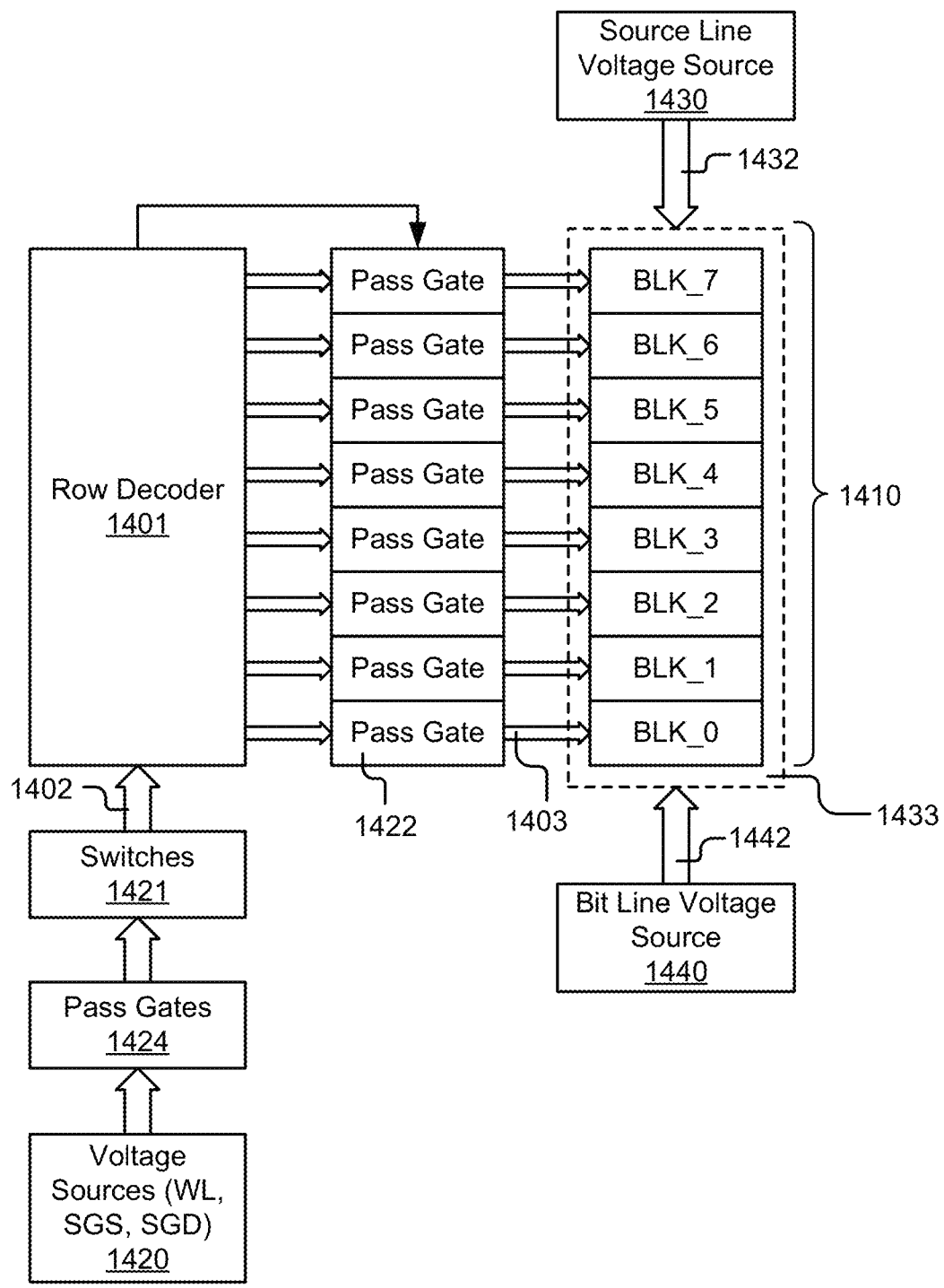
FIG. 14 depicts an example circuit for providing voltages to blocks of memory cells.

FIG. 14 depicts an example circuit for providing voltages to blocks of memory cells. In this example, a row decoder 1401 provides voltages to word lines and select gates of each block in set of blocks 1410. The set could be in a plane and includes blocks BLK0 to BLK7, for instance. The row decoder 1401 provides a control signal to pass gates 1422 which connect the blocks to the row decoder 1401. Typically, operations, e.g., program, read or erase, are performed on one selected block at a time. The row decoder 1401 can connect global control lines 1402 to local control lines 1403. The control lines represent conductive paths. Voltages are provided on the global control lines 1402 from voltage sources 1420. The voltage sources 1420 may provide voltages to switches 1421 which connect to the global control lines 1402. Pass gates 1424, also referred to as pass transistors or transfer transistors, are controlled to pass voltages from the voltage sources 1420 to the switches 1421.

The voltage sources 1420 can provide voltages on data and dummy word lines (WL) and dummy word line portions, SGS layers and SGD layer portions, for example.

The various components, including the row decoder 1401, may receive commands from a controller such as the state machine 112 or the controller 122 to perform the functions described herein.

A source line voltage source 1430 provides a voltage to the source lines/diffusion region in the substrate via control lines 1432. In one approach, the source diffusion region 1433 is common to the blocks. A set of bit lines 1442 is also shared by the blocks. A bit line voltage source 1440 provides voltages to the bit lines. In one possible implementation, the voltage sources 1420 are near the bit line voltage source.

The means described in the present disclosure can include the components of the memory device 100 of FIG. 1 or equivalents thereof, for example. The power control module 116, for instance, controls the power and voltages supplied to the word lines, source lines, select gate lines and bit lines during memory operations. Moreover, the means described above can include the components of FIG. 14 including the decoders, voltage drivers, switches, and pass transistors. The means can further include any of the control circuits in FIG. 1 such as the control circuitry 110 and controller 122.

In various implementations, the means for driving a voltage can include the power control/program voltage circuit 116 of FIG. 1, the sense circuits of FIG. 13, and the bit line voltage source 1440 of FIG. 14, or other logic hardware, and/or other executable code stored on a computer readable storage medium. Other implementations may include similar or equivalent means for transmitting data.

In various implementations, the means for increasing a voltage can include the power control/program voltage circuit 116 of FIG. 1 and the source line voltage source 1430 of FIG. 14, or other logic hardware, and/or executable code stored on a computer readable storage medium. Other implementations may include similar or equivalent means for transmitting data.

In various implementations, the means for floating a voltage can include the power control/program voltage circuit 116 including the disconnect circuit 119 of FIG. 1 and the bit line voltage source 1440 of FIG. 14, or other logic hardware, and/or executable code stored on a computer readable storage medium. Other implementations may include similar or equivalent means for transmitting data.

The foregoing detailed description of the invention has been presented for purposes of illustration and description. It is not intended to be exhaustive or to limit the invention to the precise form disclosed. Many modifications and variations are possible in light of the above teachings. The described implementations were chosen in order to best explain the principles of the invention and its practical application, to thereby enable others skilled in the art to best utilize the invention in various implementations and with various modifications as are suited to the particular use contemplated. It is intended that the scope of the invention be defined by the claims appended hereto.

What is claimed is:

1. An apparatus, comprising:
   a memory block comprising a set of memory cells of a memory channel, the memory channel comprising a first end electrically coupled to a substrate and a second end electrically coupled to a bit line, the set of memory cells including:
      a first memory cell coupled to a first word line; and
      a second memory cell coupled to a second word line; and
   an erase circuit coupled to the set of memory cells, the erase circuit configured to:
      erase the first memory cell by boosting an erase pulse applied to the first word line for a first duration beginning prior to an erase voltage applied to the memory channel; and
      erase the second memory cell by boosting an erase pulse applied to the second word line for a second duration beginning prior to the erase voltage applied to the memory channel, the first duration different than the second duration.

2. The apparatus of claim 1, wherein:
   the first memory cell is located closer to the substrate along the memory channel than the second memory cell; and
   the first duration is greater than the second duration.

3. The apparatus of claim 1, wherein:
   the first memory cell comprises a first memory hole;
   the second memory cell comprises a second memory hole; and
   a perimeter of the first memory hole is smaller than a perimeter of the second memory hole.

4. The apparatus of claim 1, wherein:
   the memory block comprises:
      a first zone comprising a first plurality of memory cells, the first plurality of memory cells including the first memory cell; and
      a second zone comprising a second plurality of memory cells, the second plurality of memory cells including the second memory cell; and
   the erase circuit is further configured to:
      erase the first zone by boosting erase pulses applied to the first plurality of memory cells for the first duration; and erase the second zone by boosting erase pulses applied to the second plurality of memory cells for the second duration.

5. The apparatus of claim 1, further comprising:
a third memory cell coupled to a third word line, the second memory cell located closer to the substrate along the memory channel than the third memory cell, wherein:
the erase circuit is further configured to erase the third memory cell by boosting an erase pulse applied to the third word line for a third duration; and
the third duration is different from the second duration and the first duration.

6. The apparatus of claim 5, wherein:
the third duration is shorter than the second duration.

7. The apparatus of claim 1, further comprising:
a temperature sensor coupled to the erase circuit, the temperature sensor configured to detect a temperature associated with the memory block, wherein the erase circuit is further configured to adapt one or more of the first duration and the second duration based on the temperature.

8. An apparatus, comprising:
an erase circuit coupled to a set of memory cells of a memory channel, the erase circuit configured to:
supply, during an erase operation, an erase voltage to the memory channel;
prior to an end of the erase operation, terminate an erase voltage applied to a first word line at a first termination time; and
terminate an erase voltage applied to a second word line at a second termination time occurring later than the first termination time, the second word line located above the first word line relative to a substrate;
wherein the erase circuit is further configured to adapt one or more of the first termination time and the second termination time based on a detected temperature of the set of memory cells.

9. The apparatus of claim 8, wherein:
prior to the end of the erase operation, the erase circuit is further configured to terminate an erase voltage applied to third word line at a third termination time; and
the third word line is located above the second word line relative to the substrate.

10. The apparatus of claim 9, wherein:
the third termination time is longer than the second termination time, and
the second termination time is longer than the first termination time.

11. The apparatus of claim 8, wherein the erase circuit is further configured to:
supply during the erase operation, the erase voltage to the memory channel;
prior to the end of the erase operation, terminate an erase voltage applied to a first zone of the set of memory cells at the first termination time, the first zone comprising one or more memory cells; and
terminate an erase pulse boost applied to a second zone of the set of memory cells at the second termination time, the second zone comprising one or more memory cells located above the first zone relative to the substrate.

12. A system comprising:
a first unit of memory cells connected to a first word line, the first unit of memory cells associated with a plurality of memory channels;
a second unit of memory cells connected to a second word line, the second unit of memory cells being associated with the plurality of memory channels;
a control circuit coupled to the first unit of memory cells and the second unit of memory cells, the control circuit configured to perform an erase operation on the first unit of memory cells and the second unit of memory cells, the control circuit comprising:
a row decoder circuit configured to select the first word line and the second word line for the erase operation; and
an erase circuit configured to:
erase the first unit of memory cells by boosting an erase pulse applied to the first word line and erase the second unit of memory cells by boosting an erase pulse applied to the second word line using different erase pulse boost durations beginning prior to an erase voltage applied to the plurality of memory channels.

13. The system of claim 12, wherein the second word line is positioned further from a substrate than the first word line.

14. The system of claim 12, further comprising:
a third unit of memory cells connected to a third word line, the third unit of memory cells associated with the plurality of memory channels; and
the control circuit coupled to the third unit of memory cells, the control circuit further configured to perform an erase operation on the third unit of memory cells by:
selecting using the row decoder circuit, the third word line for the erase operation; and
erasing using the erase circuit, the third unit of memory cells by boosting an erase pulse applied to the third word line for an erase pulse boost duration that is shorter than an erase pulse boost duration used to erase the second unit of memory cells.

15. The system of claim 12, further comprising:
a temperature sensor coupled to the erase circuit, the temperature sensor configured to detect a temperature associated with the first unit of memory cells and the second unit of memory cells, wherein the erase circuit is further configured to adapt one or more of the different erase pulse boost durations based on the temperature.

16. A method comprising:
supplying, during an erase operation, an erase voltage to a memory channel, the memory channel including a set of memory cells;
prior to an end of the erase operation, terminating an erase voltage applied to a first word line at a first termination time; and
terminating an erase voltage applied to a second word line at a second termination time occurring later than the first termination time, the second word line located above the first word line relative to a substrate;
wherein the one or more of the first termination time and the second termination time are adapted based on a detected temperature of the set of memory cells.

17. The method of claim 16, further comprising terminating an erase voltage applied to a third word line at a third termination time occurring later than the second termination time, the third word line located above the second word line relative to the substrate.

18. The method of claim 16, wherein supplying the erase voltage comprises supplying an erase pulse to the first word line and to the second word line.

* * * * *